US 12,237,276 B2

(12) United States Patent
Lai et al.

(10) Patent No.: US 12,237,276 B2
(45) Date of Patent: Feb. 25, 2025

(54) PACKAGE STRUCTURE

(71) Applicant: Taiwan Semiconductor Manufacturing Company, Ltd., Hsinchu (TW)

(72) Inventors: Po-Chen Lai, Hsinchu County (TW); Chin-Hua Wang, New Taipei (TW); Ming-Chih Yew, Hsinchu (TW); Che-Chia Yang, Taipei (TW); Shu-Shen Yeh, Taoyuan (TW); Po-Yao Lin, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/336,258

(22) Filed: Jun. 16, 2023

(65) Prior Publication Data
US 2023/0343724 A1    Oct. 26, 2023

Related U.S. Application Data

(63) Continuation of application No. 17/350,317, filed on Jun. 17, 2021, now Pat. No. 11,721,643.

(51) Int. Cl.
H01L 23/31       (2006.01)
H01L 21/48       (2006.01)
(Continued)

(52) U.S. Cl.
CPC ........ H01L 23/562 (2013.01); H01L 21/4853 (2013.01); H01L 21/4857 (2013.01);
(Continued)

(58) Field of Classification Search
CPC .......... H01L 23/5386; H01L 23/49838; H01L 23/49816; H01L 25/0655
See application file for complete search history.

(56) References Cited

U.S. PATENT DOCUMENTS 8,405,231 B2    3/2013  Hayashi
9,000,584 B2    4/2015  Lin et al.
(Continued)

FOREIGN PATENT DOCUMENTS

CN    101719486 A    6/2010
TW    202006923 A    2/2020

OTHER PUBLICATIONS

Chinese language office action dated Oct. 7, 2022, issued in application No. TW 111105060.

*Primary Examiner* — Evan G Clinton
(74) *Attorney, Agent, or Firm* — McClure, Qualey & Rodack, LLP

(57) ABSTRACT

A package structure is provided. The package structure includes a semiconductor die over a redistribution structure, bonding elements below the redistribution structure, and an underfill layer surrounding the bonding elements and the redistribution structure. The semiconductor die has a rectangular profile in a plan view. A pitch of the bonding elements is defined as the sum of a diameter of the bonding elements and a spacing between neighboring two of the bonding elements. A first circular area of the redistribution structure is entirely covered and in direct contact with the underfill layer. The center of the first circular area is aligned with a first corner of the rectangular profile of the semiconductor die. A diameter of the first circular area is greater than twice the pitch of the bonding elements.

11 Claims, 21 Drawing Sheets

(51) Int. Cl.
*H01L 21/56* (2006.01)
*H01L 21/683* (2006.01)
*H01L 23/00* (2006.01)
*H01L 23/538* (2006.01)
*H01L 25/065* (2023.01)

(52) U.S. Cl.
CPC .......... *H01L 21/563* (2013.01); *H01L 21/565* (2013.01); *H01L 21/568* (2013.01); *H01L 21/6835* (2013.01); *H01L 23/3128* (2013.01); *H01L 23/3135* (2013.01); *H01L 23/5383* (2013.01); *H01L 23/5386* (2013.01); *H01L 24/16* (2013.01); *H01L 25/0652* (2013.01); *H01L 25/0655* (2013.01); *H01L 2221/68372* (2013.01); *H01L 2224/16227* (2013.01); *H01L 2225/06517* (2013.01); *H01L 2225/06541* (2013.01); *H01L 2225/06586* (2013.01); *H01L 2924/18161* (2013.01); *H01L 2924/3512* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,593,629 B2 | 3/2020 | Chiang et al. |
| 2005/0218528 A1 | 10/2005 | Beatty et al. |
| 2011/0001230 A1 | 1/2011 | Li et al. |
| 2011/0068485 A1 | 3/2011 | Meyer et al. |
| 2016/0064316 A1* | 3/2016 | Carpenter ......... H01L 23/49838 438/126 |

\* cited by examiner

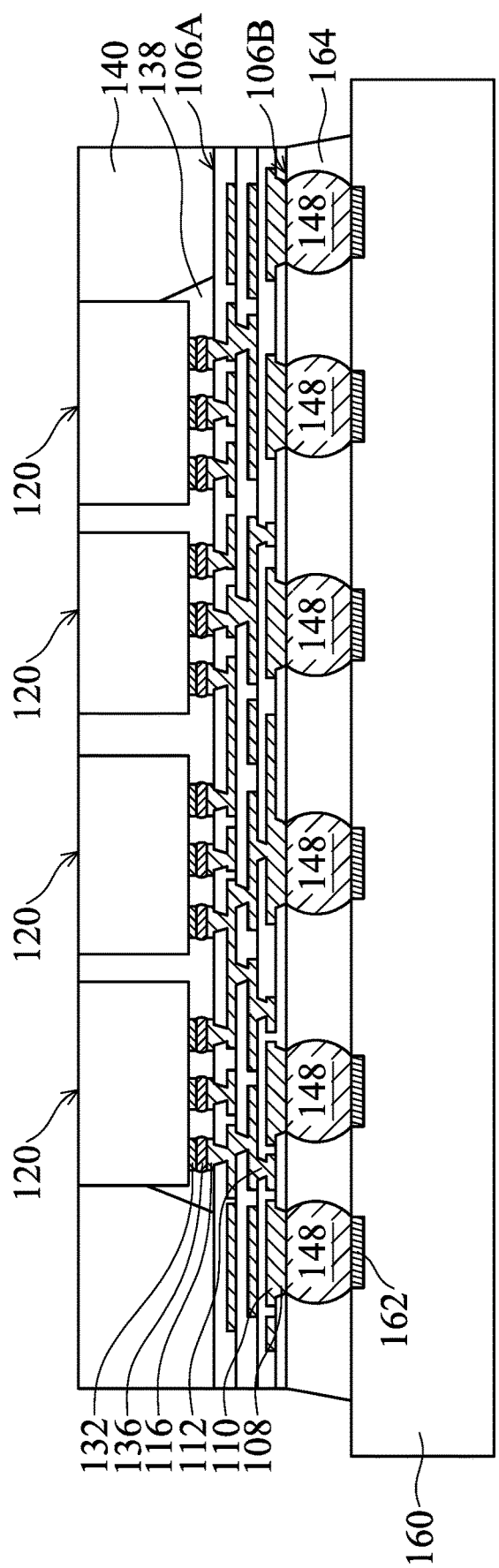
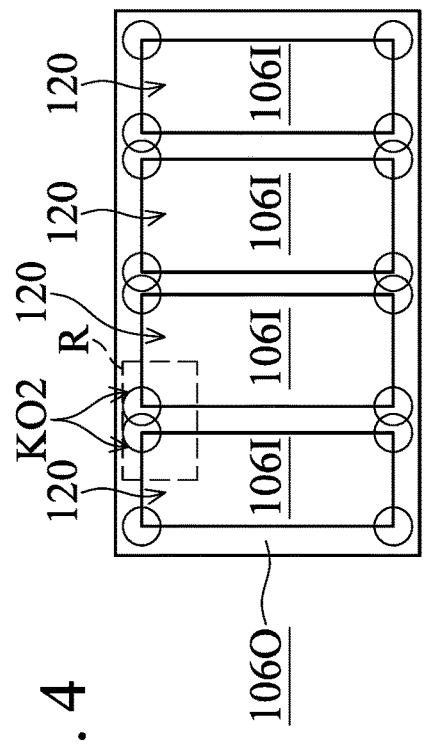
FIG. 4
FIG. 4-1

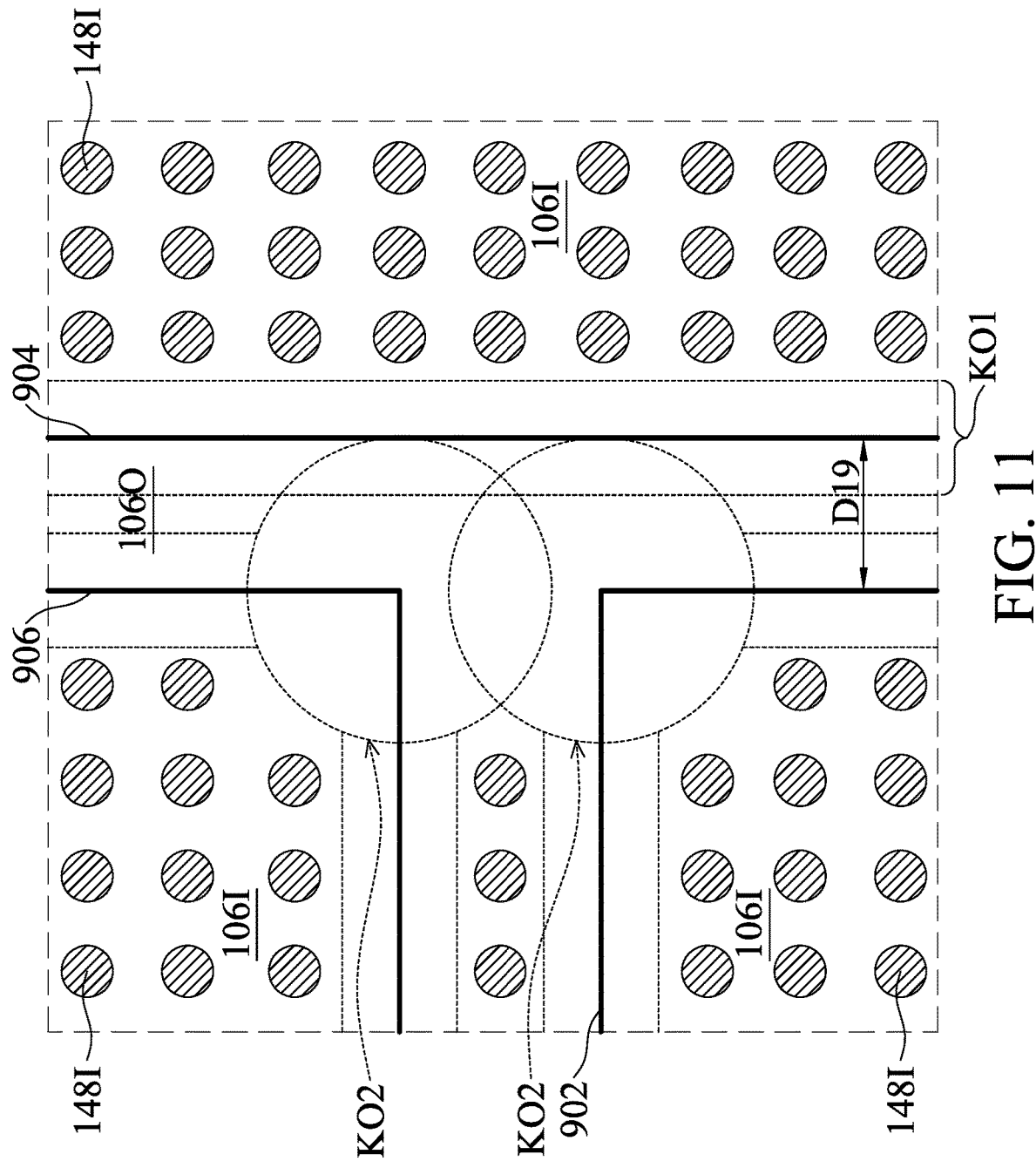

PACKAGE STRUCTURE

RELATED APPLICATIONS

The present application is a continuation application of U.S. application Ser. No. 17/350,317, filed on Jun. 17, 2021, entitled of "PACKAGE STRUCTURE," now U.S. Pat. No. 11,721,643, which is incorporated herein by reference in its entirety.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize a smaller area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1A-1 is a plan view of the package structure shown in FIG. 1A, in accordance with some embodiments of the disclosure.

FIG. 1B-1 is a plan view of the package structure shown in FIG. 1B, in accordance with some embodiments of the disclosure.

FIG. 1G-1 is a plan view of the package structure shown in FIG. 1G, in accordance with some embodiments of the disclosure.

FIG. 1G-2 is an enlarged plan view of area R shown in FIG. 1G-1 to illustrate details of bonding elements, in accordance with some embodiments of the disclosure.

FIG. 2 is a modification of FIG. 1G-2, in accordance with some embodiments of the disclosure.

FIG. 4 is a modification of the cross-sectional view illustrated in FIG. 1H, in accordance with some embodiments of the disclosure.

FIG. 4-1 is a plan view of the package structure shown in FIG. 4, in accordance with some embodiments of the disclosure.

FIG. 5 is a modification of the cross-sectional view illustrated in FIG. 4, in accordance with some embodiments of the disclosure.

FIG. 5-1 is a plan view of the package structure shown in FIG. 5, in accordance with some embodiments of the disclosure.

FIG. 11 is an enlarged plan view of area R1 shown in FIG. 5-1 to illustrate details of bonding elements, in accordance with some embodiments of the disclosure.

DETAILED DESCRIPTION

Figure 1A:
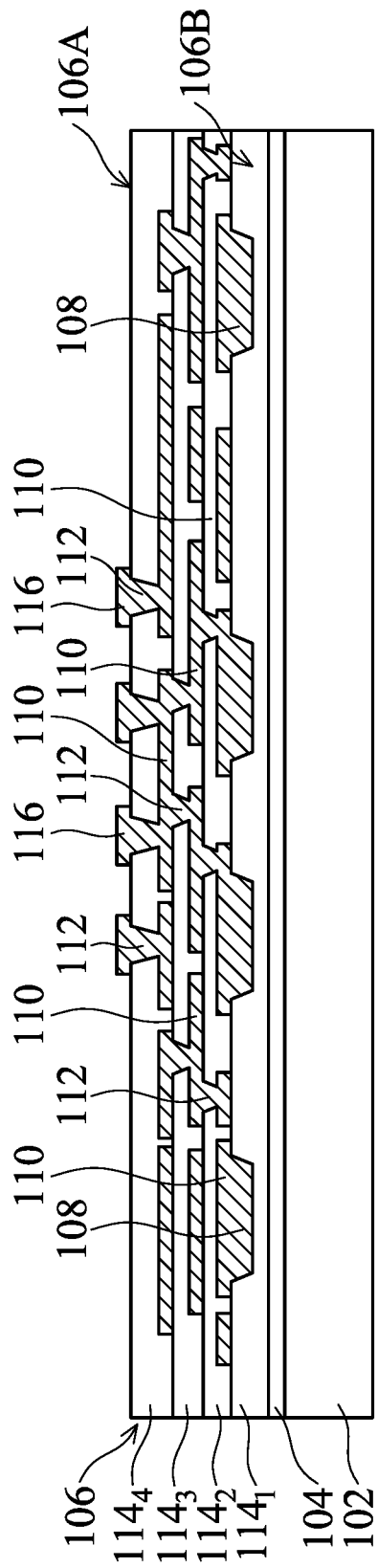
FIGS. 1A through 1H are cross-sectional views illustrating the formation of a package structure at various intermediate stages, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of a package structure are provided. The package structure may include a semiconductor die over a redistribution structure and bonding elements below the redistribution structure. The bonding elements may be kept at an appropriate distance from the corners of the semiconductor die by defining keep-out zones of the bonding elements, thereby reducing or mitigating a tensile stress induced by the bonding elements. As a result, the risk of cracking of an underfill material may be reduced, and thus the performance and reliability of the package structure may be improved.

FIGS. 1A through 1H are cross-sectional views illustrating the formation of a package structure at various intermediate stages, in accordance with some embodiments of the disclosure.

A carrier substrate 102 is received or provided, as shown in FIG. 1A, in accordance with some embodiments. In some embodiments, the carrier substrate 102 is a ceramic substrate, a glass substrate, a polymer substrate, a semiconductor substrate, or another suitable substrate.

An adhesive tape 104 is disposed over the carrier substrate 102, as shown in FIG. 1A, in accordance with some embodiments. In some embodiments, the adhesive tape 104 is sensitive to an energy beam irradiation. In some embodiments, the adhesive tape 104 is a release layer that is made of or includes a light-to-heat conversion (LTHC) material. For example, a laser beam may be used to irradiate the adhesive tape 104 in a subsequent process. The irradiation may allow a package structure formed over the adhesive tape 104 to be separated from the carrier substrate 102.

A redistribution structure 106 is formed over the adhesive tape 104, as shown in FIG. 1A, in accordance with some embodiments. The redistribution structure 106 is configured for routing, which enables the formation of a package structure with fan-out features. The redistribution structure 106 may also be referred to as an interposer. The redistribution structure 106 has a bottom surface 106B facing the carrier substrate 102 and a top surface 106A facing away from the carrier substrate 102, in accordance with some embodiments.

In some embodiments, the redistribution structure 106 includes multiple insulating layers such as insulating layers $114_1$, $114_2$, $114_3$ and $114_4$ and multiple conductive features such as conductive features 108, 110 and 112 formed in the insulating layers. Although FIG. 1A shows four insulating layers $114_1$-$114_4$, the number of the insulating layers is not limited thereto and the redistribution structure 106 may include less or more the insulating layers.

In some embodiment, the conductive features 108 are surrounded by and/or embedded in the insulating layers $114_1$. In some embodiment, the conductive features 108 are under-bump metallurgies (UBMs). In some embodiments, the conductive features 108 are to be exposed from or protrude from the bottom surface 106B of the redistribution structure 106 and used to hold or receive bonding elements.

In some embodiments, the conductive features 108 are made of or include metallic material such as titanium, copper, nickel, tantalum, vanadium, chromium, gold, tungsten, an alloy thereof, a multi-layer thereof, or a combination thereof. In some embodiments, the conductive features 108 are made of non-solder metallic material.

In some embodiments, the conductive features 110 are surrounded by and/or embedded in the insulating layers $114_2$-$114_4$. In some embodiments, the conductive features 110 include conductive pads, conductive lines and/or conductive traces and are configured to provide horizontal electrical routing. In some embodiments, the conductive features 108 are in contact with the conductive features 110 (e.g., conductive pads) in the insulating layer $114_2$.

In some embodiments, the conductive features 112 are surrounded by and/or embedded in the insulating layers $114_2$-$114_4$. In some embodiments, the conductive features 112 are conductive vias and configured to provide vertical electrical routing. In some embodiments, the conductive features 112 land on the conductive pads of the conductive features 110, thereby electrically coupling the conductive features 110 in different insulating layers 114. In some embodiments, the conductive features 112 in the insulating layer $114_4$ are exposed from and/or protruding from the top surface 106A of the insulating layer $114_4$ of the redistribution structure 106 and are used to hold or receive one or more bonding elements.

In some embodiments, the insulating layers 114 may be made of one or more polymer materials. The polymer material(s) may include polybenzoxazole (PBO), benzocyclobutene (BCB), polyimide (PI), epoxy-based resin, one or more other suitable polymer materials, or a combination thereof. In some embodiments, the polymer material is photosensitive. A photolithography process may therefore be used to form openings with desired patterns in the insulating layers $114_1$-$114_4$. In alternative embodiments, the insulating layers 114 are made of one or more dielectric materials such as silicon oxide, silicon nitride and/or silicon oxynitride.

In some embodiments, the conductive features 110 and 112 are made of metallic material such as copper, aluminum, gold, palladium, cobalt, titanium, nickel, silver, graphene, one or more other suitable conductive materials, an alloy thereof, or a combination thereof. In some embodiments, the conductive features 110 and 112 are made of non-solder metallic material. In some embodiments, the conductive features 110 and 112 include multiple sub-layers. For example, each of the conductive features 110 and 112 contains multiple sub-layers including Ti/Cu, Ti/Ni/Cu, Ti/Cu/Ti, Al/Ti/Ni/Ag, other suitable sub-layers, or a combination thereof.

The formation of the redistribution structure 106 may involve multiple deposition processes, multiple patterning processes, and/or multiple planarization processes. The deposition processes may be used to form insulating layers and/or conductive layers. The deposition processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, a dry polishing process, one or more other applicable processes, or a combination thereof.

Figures 1, 1A:
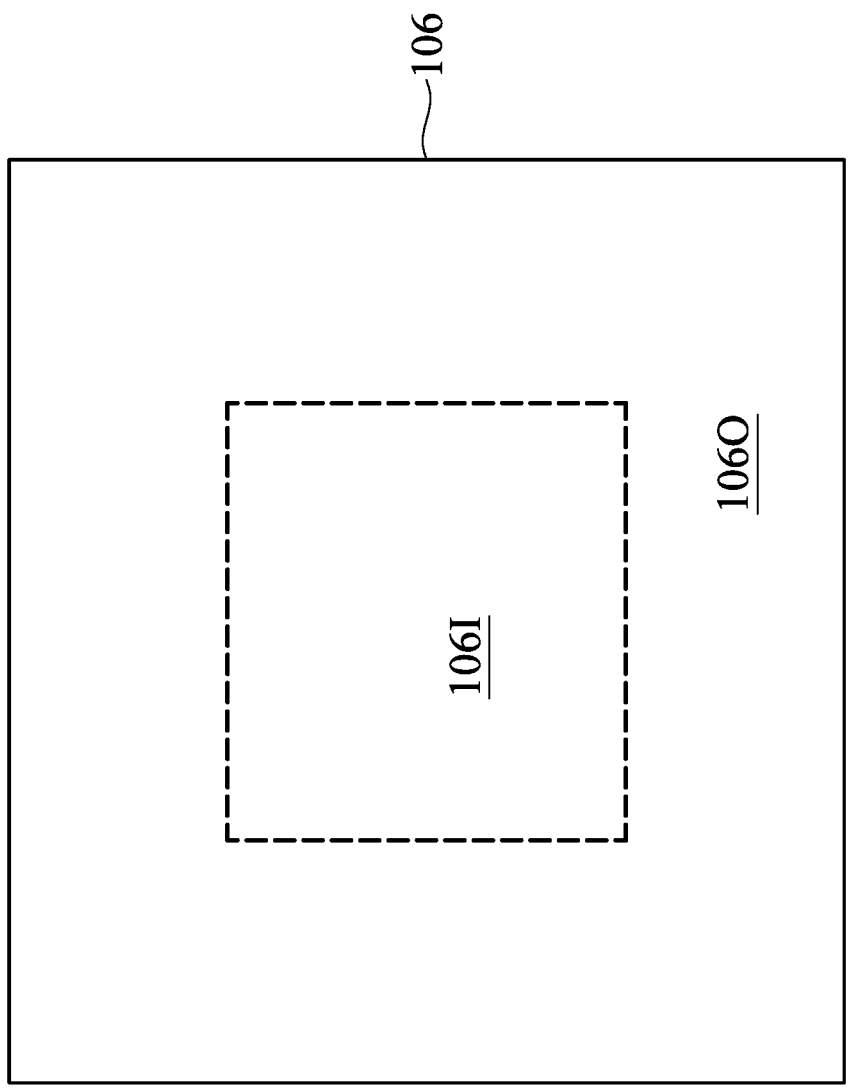

FIG. 1A-1 is a plan view of the package structure shown in FIG. 1A, in accordance with some embodiments of the disclosure. FIG. 1A-1 illustrates the redistribution structure 106 which includes a fan-in region 106I in which a semiconductor die is to be disposed and a fan-out region 106O adjoining the fan-in region 106I. The fan-out region 106O continuously surrounds the fan-in region 106I, in accordance with some embodiments. Embodiments of the disclosure are not limited thereto. The redistribution structure 106 may include more than one fan-in regions 106I in which semiconductor dies and/or other package components are to be disposed correspondingly.

Referring back to FIG. 1A, conductive features 116 are formed over the top surface 106A of the redistribution structure 106, in accordance with some embodiments. In some embodiments, the conductive features 116 are formed on and in contact with the conductive features 112.

In some embodiments, the conductive features 116 are Under-Bump Metallurgies (UBMs). In some embodiments, the conductive features 116 are used to hold or receive one or more bonding elements such as solder balls. In some embodiments, the conductive features 116 are made of or include metallic material such as titanium, copper, nickel, tantalum, vanadium, chromium, gold, tungsten, an alloy thereof, a multi-layer thereof, or a combination thereof. In some embodiments, the conductive features 116 are made of non-solder metallic material.

Figure 1B:
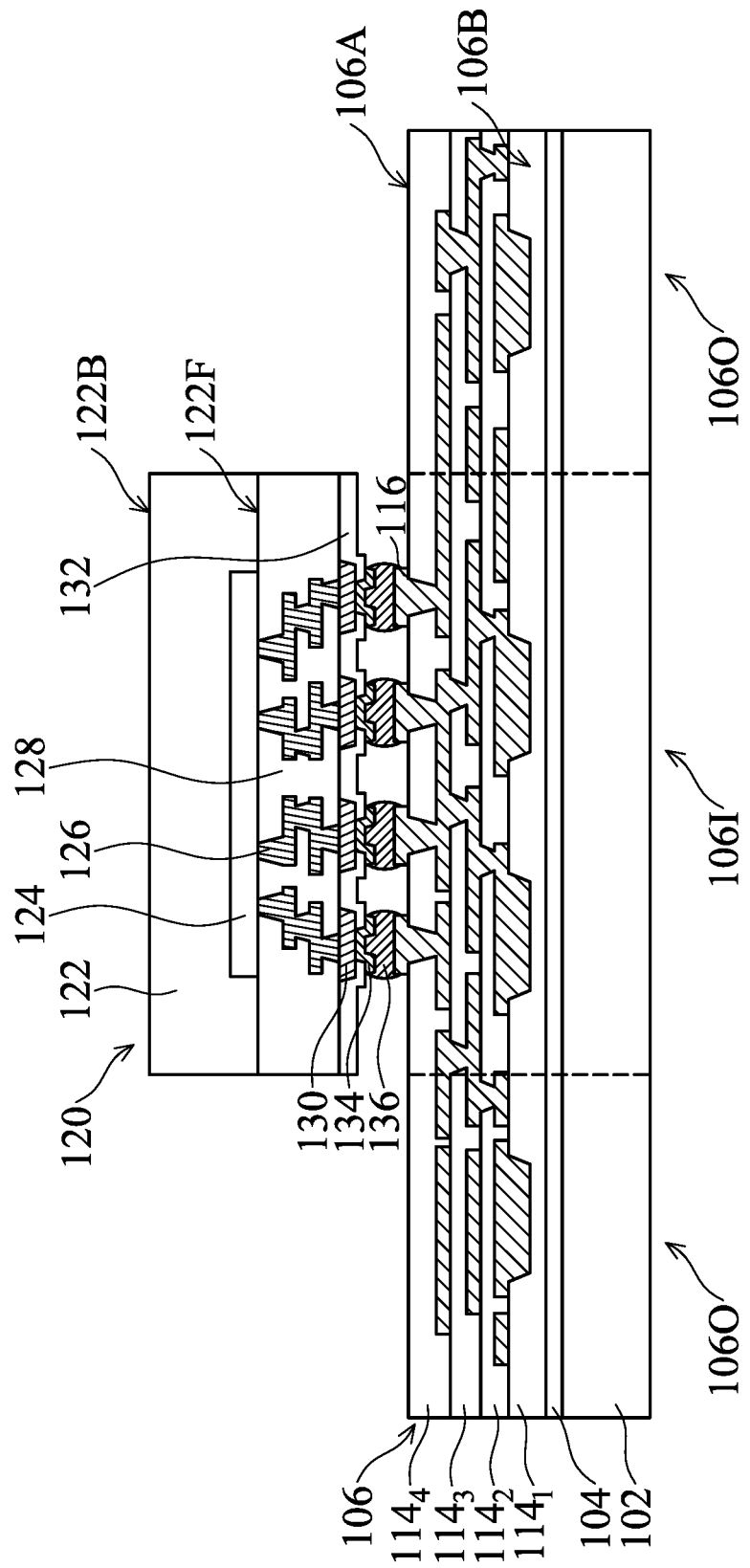
Figures 1, 1B:
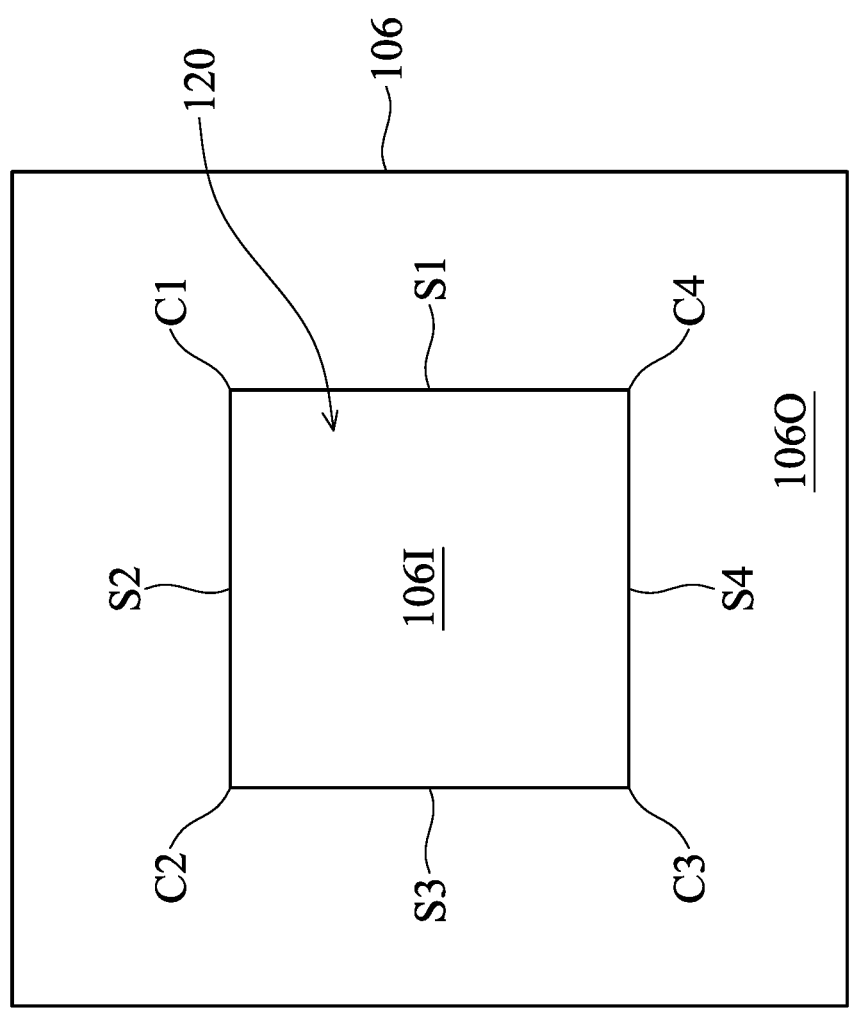

A semiconductor die 120 is disposed over the top surface 106A of the redistribution structure 106, as shown in FIG. 1B, in accordance with some embodiments. The semiconductor die 120 is disposed within the fan-in region 106I of the redistribution structure 106, in accordance with some embodiments. The semiconductor die 120 is bonded to the conductive features 116 through bonding elements 136, in accordance with some embodiments.

The semiconductor die 120 may include application processors, power management integrated circuits, logic devices, memory devices (e.g., static random access memories, SRAMs), radio frequency (RF) devices, input/output (I/O) devices, system-on-chip (SoC) devices, one or more other suitable circuits, or a combination thereof.

In some embodiments, the semiconductor die 120 includes a semiconductor substrate 122 having a backside surface 122B and a front surface 122F. In some embodiments, the semiconductor die 120 also includes an integrated circuit 124 formed in and/or on the front surface 122F of the semiconductor substrate 122. In some embodiments, the semiconductor die 120 also includes an interconnect structure 126 surrounded by an intermetal (IMD) dielectric layer 128 and electrically coupled to the integrated circuit 124. In some embodiments, the semiconductor die 120 also includes conductive pads 130 formed over and electrically coupled to the interconnect structure 126. In some embodiments, the semiconductor die 120 also includes a passivation layer 132 partially covering the conductive pads 130 and UBMs 134 passing through the passivation layer 132 and formed on the conductive pads 130.

The UBMs 134 of the semiconductor die 120 are bonded to the conductive features 116 over the redistribution structure 106 such as by flip-chip bonding, e.g., by using the bonding elements 136, in accordance with some embodiments. In some embodiments, a thermal reflow operation is carried out. In some embodiments, the bonding elements 136 correspond to and connect the UBMs 134 of the semiconductor die 120 and the conductive features 116. As such, the integrated circuit 124 is electrically coupled to the conductive features 108, 110 and 112 of the redistribution structure 106, in accordance with some embodiments.

In some embodiments, the bonding elements 136 are solder joints, microbumps, solder bumps, solder balls, ball grid array (BGA) balls, controlled collapse chip connection (C4) bumps, another suitable bonding elements, and/or a combination thereof. In some embodiments, the bonding elements 136 are tin-containing solder balls bumps or solder balls. The tin-containing solder bumps or balls may include copper, silver, gold, aluminum, lead, one or more other suitable materials, or a combination thereof. In some embodiments, the bonding elements 136 are lead-free.

FIG. 1B-1 is a plan view of the package structure shown in FIG. 1B, in accordance with some embodiments of the disclosure. In some embodiments, the semiconductor die 120 has a rectangular- or square-shaped profile, in FIG. 1B-1. In some embodiments, the periphery (or edges) of the semiconductor die 120 is aligned with the boundary between the fan-in region 106I and the fan-out region 106O of the redistribution structure 106.

In some embodiments, the periphery of the semiconductor die 120 includes four sidewalls S1, S2, S3 and S4. The sidewalls S1 and S2 intersect at a corner C1; the sidewalls S2 and S3 intersect at a corner C2; the sidewalls S3 and S4 intersect at a corner C3; and the sidewalls S4 and S1 intersect at a corner C4.

Figure 1C:
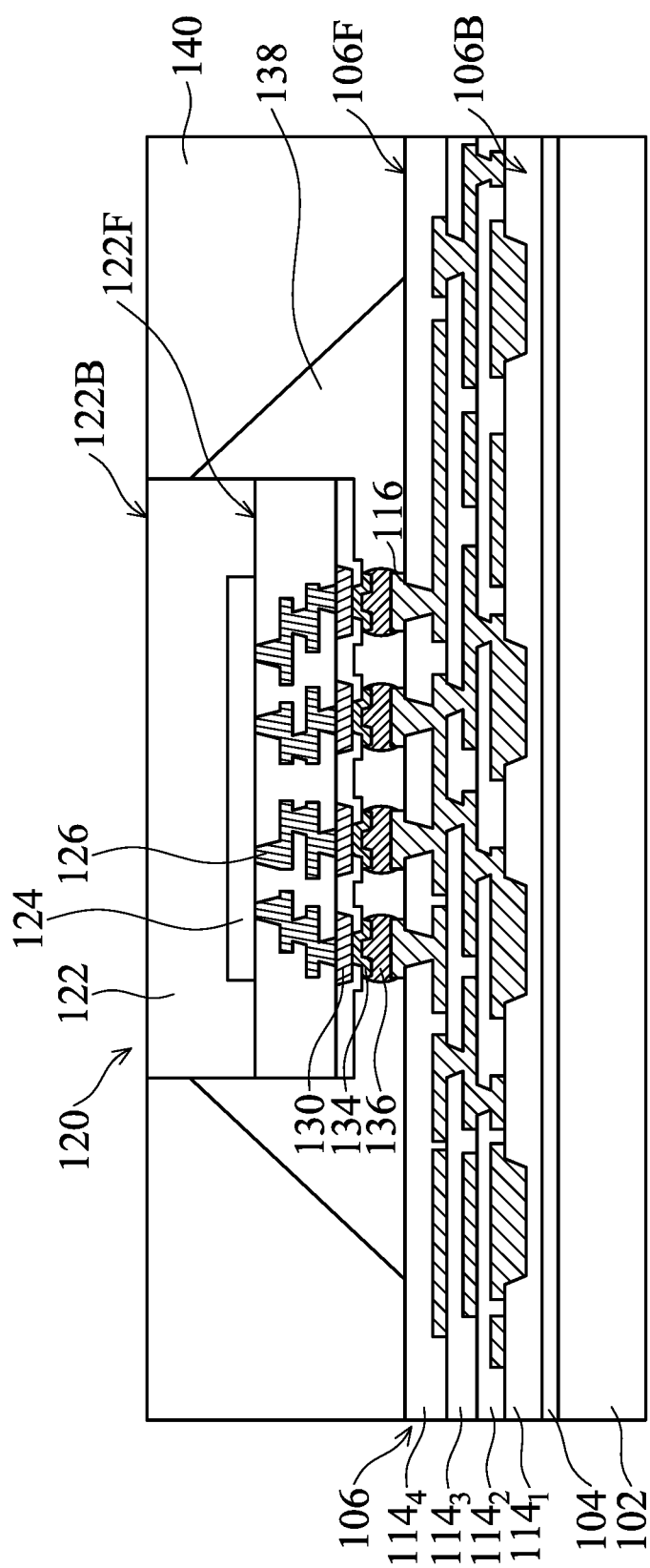

An underfill material 138 is formed over the top surface 106A of the redistribution structure 106, thereby encapsulating the semiconductor die 120, the bonding elements 136, and the conductive features 116, as shown in FIG. 1C, in accordance with some embodiments. The underfill material 138 fills the spacing between the bonding elements 136, in accordance with some embodiments. In some embodiments, an upper portion of the sidewalls of the semiconductor substrate 122 is not covered by the underfill material 138.

In some embodiments, the underfill material 138 is an electrically insulated adhesive for protecting the bonding elements 136 and the conductive features 116 and/or securing the semiconductor die 120. In some embodiments, the underfill material 138 is made of epoxy, resin, epoxy molding compounds, another suitable underfill material, and/or a combination thereof.

A molding compound 140 is formed over the top surface 106A of the redistribution structure 106, thereby encapsulating the underfill material 138 and the semiconductor die 120, as shown in FIG. 1C, in accordance with some embodiments. In some embodiments, the molding compound 140 is a single-layer film or a composite stack. In some embodiments, molding compound 140 includes various materials, such as molding underfill, epoxy, resin, or the like. In some embodiments, the molding compound 140 has high thermal conductivity, low moisture absorption rate and high flexural strength.

The molding compound 140 are then planarized until the backside surface 122B of the semiconductor substrate 122 is exposed, in accordance with some embodiments. The planarization processes may include a mechanical grinding process, a chemical mechanical polishing (CMP) process, a dry polishing process, one or more other applicable processes, or a combination thereof.

Figure 1D:
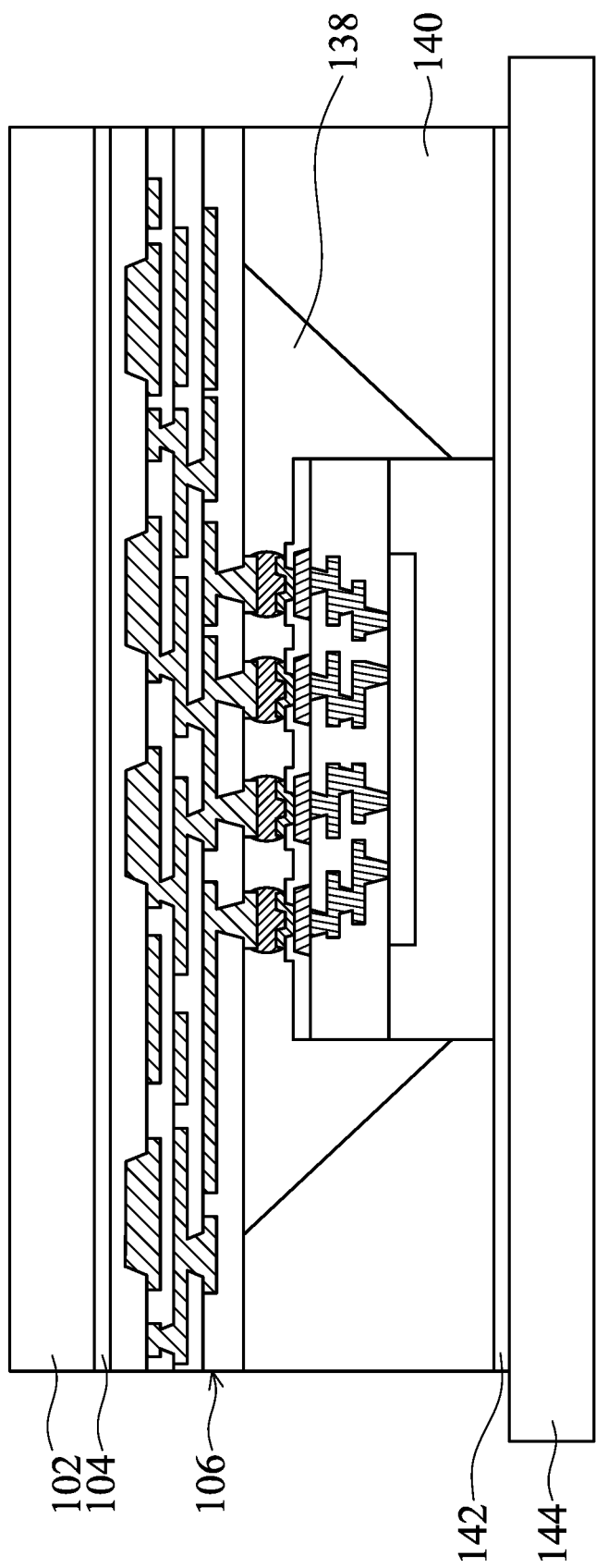

The upper surface (e.g., the backside surface 122B of the semiconductor substrate 122) of the structure of FIG. 1C is attached to a carrier substrate 144 and then flipped upside down, as shown in FIG. 1D, in accordance with some embodiments. The carrier substrate 144 is attached to the semiconductor substrate 122 and the molding compound 140 through an adhesive tape 142, thereby covering the semiconductor substrate 122 and the molding compound 140, in accordance with some embodiments. The carrier substrate 144 is configured to protect the semiconductor substrate 122 from being damaged during following processes, in accordance with some embodiments.

In some embodiments, the carrier substrate 144 is a ceramic substrate, a glass substrate, a polymer substrate, a semiconductor substrate, or another suitable substrate. In some embodiments, the adhesive tape 142 is a release layer that is made of or includes a light-to-heat conversion (LTHC) material. In some embodiments, the adhesive tape 142 is made of a different material than the adhesive tape 104.

Figure 1E:
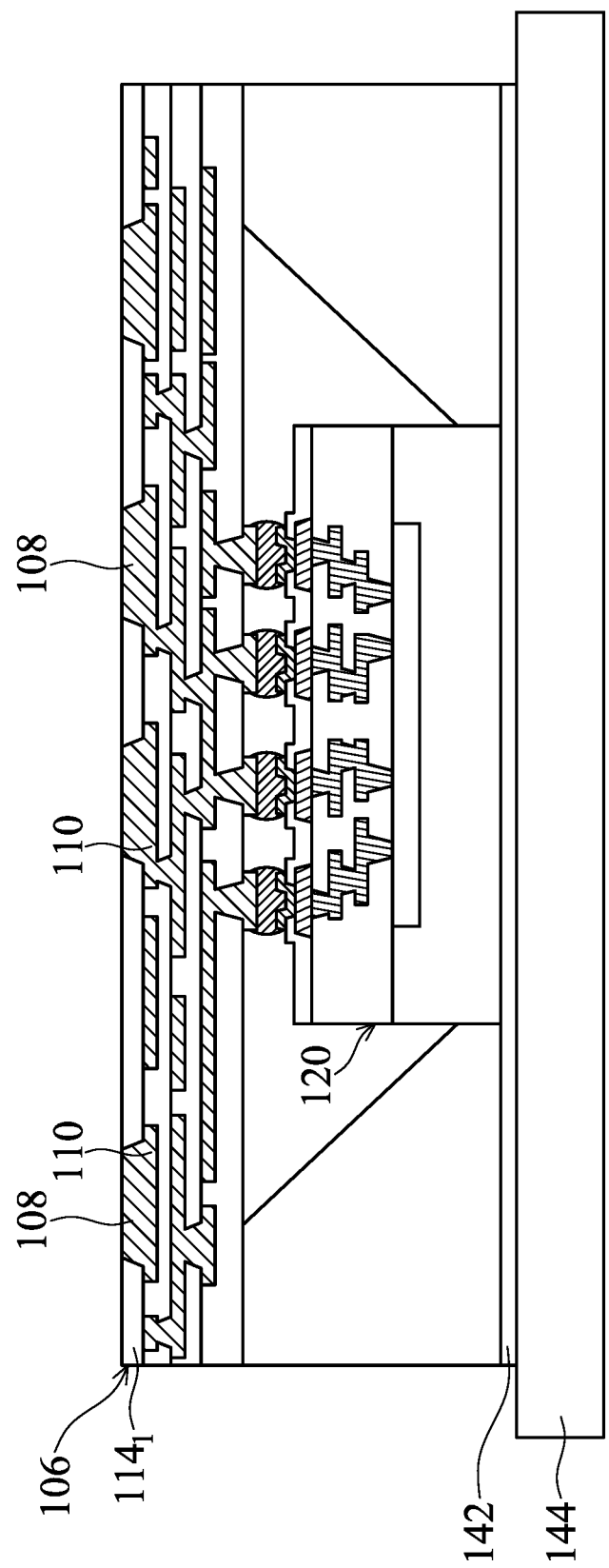

The carrier layer 102 is then taken away from the redistribution structure 106 by separating the adhesive tape 104 from the carrier layer 102 and the redistribution structure 106, as shown in FIG. 1E, in accordance with some embodiments. For example, a release process may be performed by irradiating the structure with an energy beam such as laser beam, an ultraviolet light, or another suitable energy beam. After the irradiation, the adhesive characteristics of the adhesive tape 104 may be destroyed or reduced. In some embodiments, the adhesive tape 142 may maintain adhesive even if being irradiated with the energy beam. After the release process, the insulating layer $114_1$ of the redistribution structure 106 is exposed, in accordance with some embodiments.

A planarization process is performed on the insulating layer $114_1$ of the redistribution structure 106 until the conductive features 108 are exposed from the insulating layer $114_1$, as shown in FIG. 1E, in accordance with some embodiments. The planarization processes may include a mechanical grinding process, a chemical mechanical polishing (CMP) process, a dry polishing process, one or more other applicable processes, or a combination thereof.

Figure 1F:
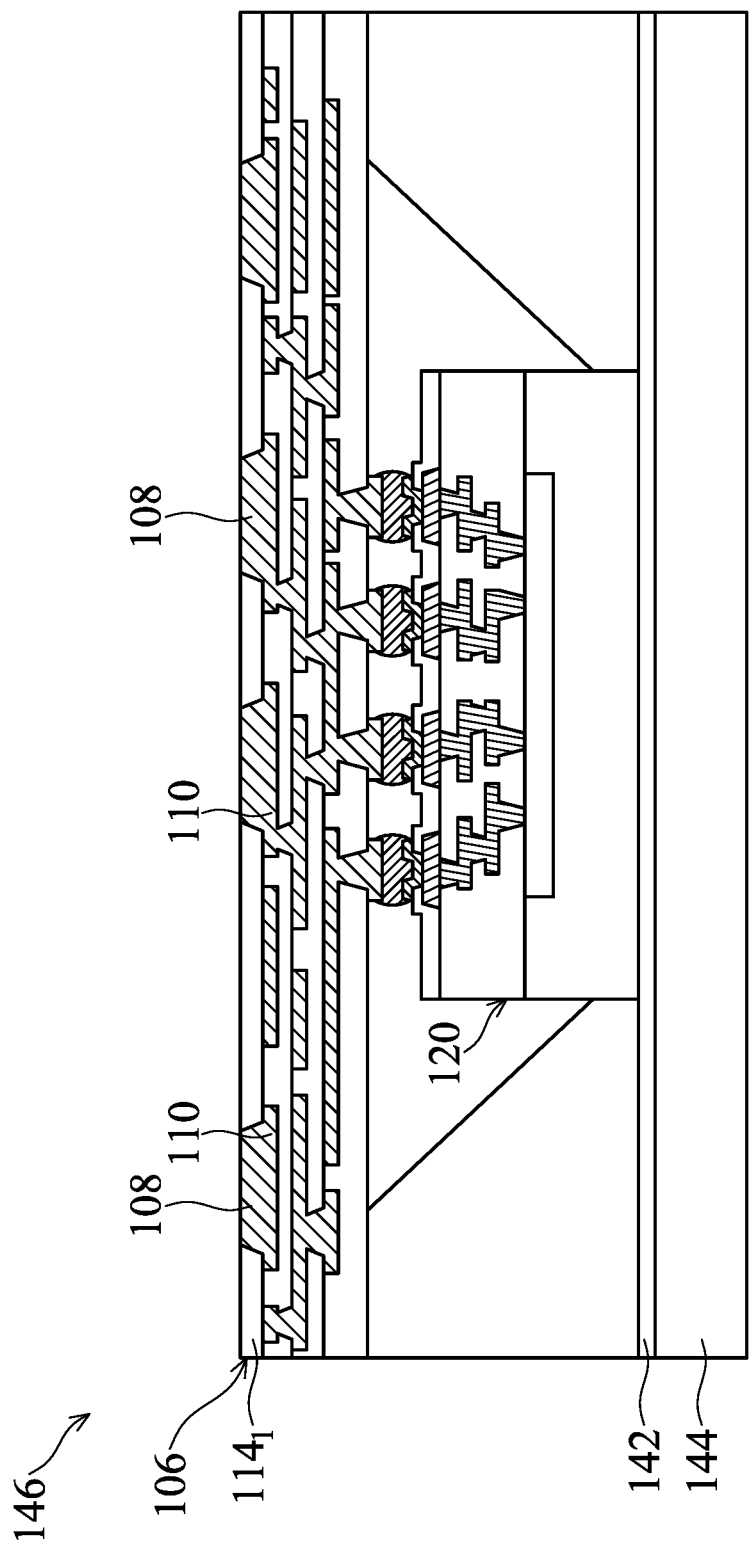

A sawing operation is performed to cut through the structure of FIG. 1E into multiple package structures 146 that are separated from one another, as shown in FIG. 1F, in accordance with some embodiments. FIG. 1F shows the cross-sectional view of one of the obtained package structures 146.

The carrier substrate 144 is then taken away from the package structure 146 by separating the adhesive tape 142 from the carrier substrate 144 and the semiconductor die 120 (and the molding compound 140), in accordance with some embodiments. For example, a release process may be performed by irradiating the structure with an energy beam such as laser beam, an ultraviolet light, or another suitable energy beam. After the irradiation, the adhesive characteristics of the adhesive tape 142 may be destroyed or reduced.

Figure 1G:
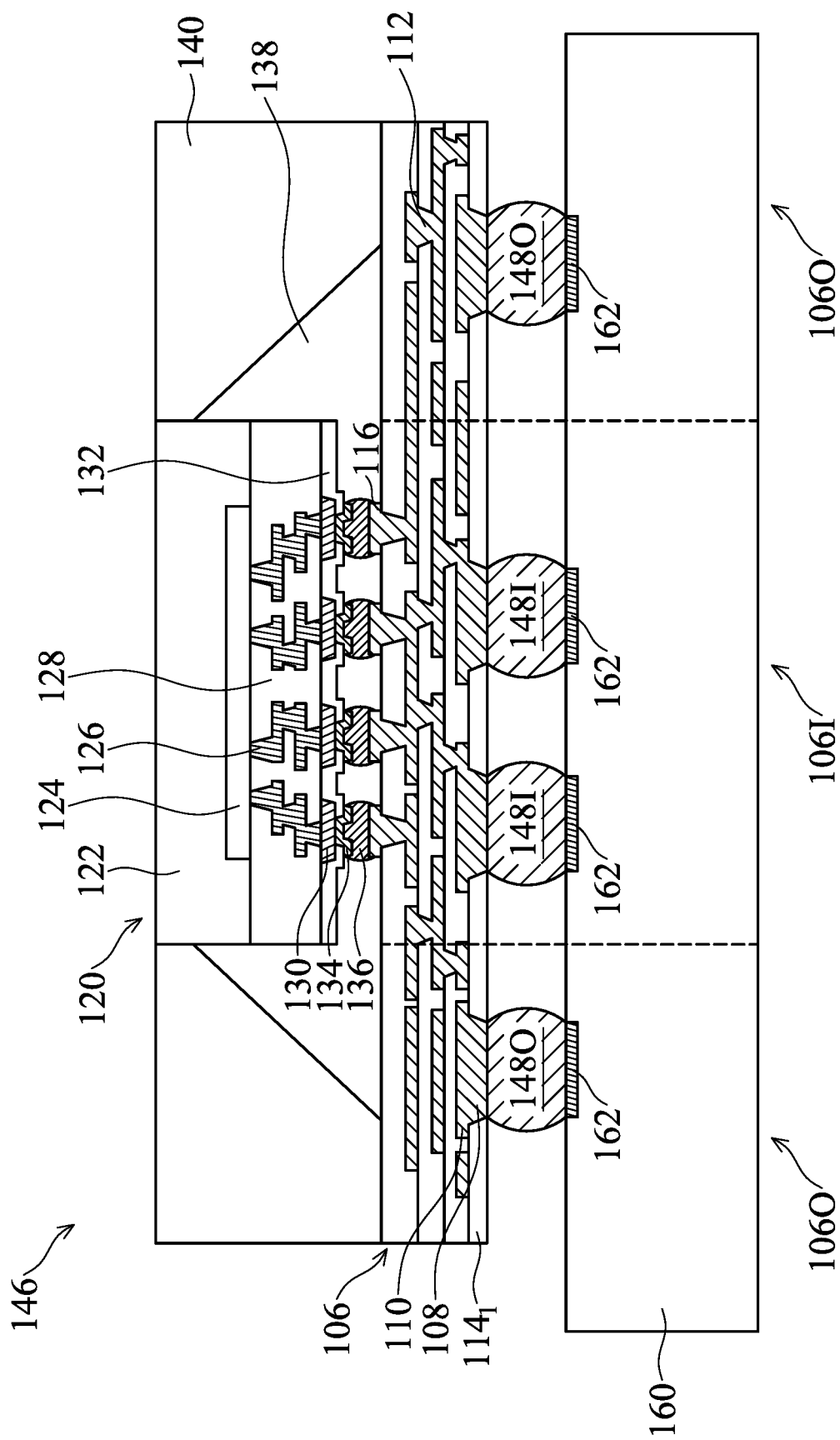

A package structure 146 is disposed over and bonded to a substrate 160 through bonding elements 148, as shown in FIG. 1G, in accordance with some embodiments. The bonding elements 148 disposed within the fan-in region 106I are referred to as inner bonding elements 148I, and the bonding elements 148 disposed within the fan-out region 106O are referred to as outer bonding elements 148O, in accordance with some embodiments. In some embodiments, the plurality of inner bonding elements 148I and the plurality of the outer bonding elements 148O are each arranged into an array.

In some embodiments, the substrate 160 is a printed circuit board (PCB). In alternative embodiments, the substrate 160 is an interposer substrate that may then be bonded to another substrate. In some embodiments, the substrate 160 is fabricated with a predetermined functional circuit thereon. For example, the functional circuit may include conductive pad, conductive lines, conductive traces, conductive vias and/or active circuitry components such as transistor, diode, and the like. In some embodiments, the substrate 160 includes conductive pads 162 exposed from and/or protruding from the upper surface of the substrate 160.

In some embodiments, the bonding elements 148 are solder joints, controlled collapse chip connection (C4) bumps, solder bumps, solder balls, ball grid array (BGA) balls, another suitable bonding elements, and/or a combination thereof. In some embodiments, the bonding elements 148 are tin-containing solder balls bumps or solder balls. The tin-containing solder bumps or balls may include copper, silver, gold, aluminum, lead, one or more other suitable materials, or a combination thereof. In some embodiments, the bonding elements 148 are lead-free.

The conductive features 108 of the redistribution structure 106 are bonded to the conductive pads 162 of the substrate 160 through using the bonding elements 148, in accordance with some embodiments. In some embodiments, a thermal reflow operation is carried out. As such, the integrated circuit 124 of the semiconductor die 120 is electrically coupled to the substrate 160, in accordance with some embodiments.

Figures 1, 1G, 2:
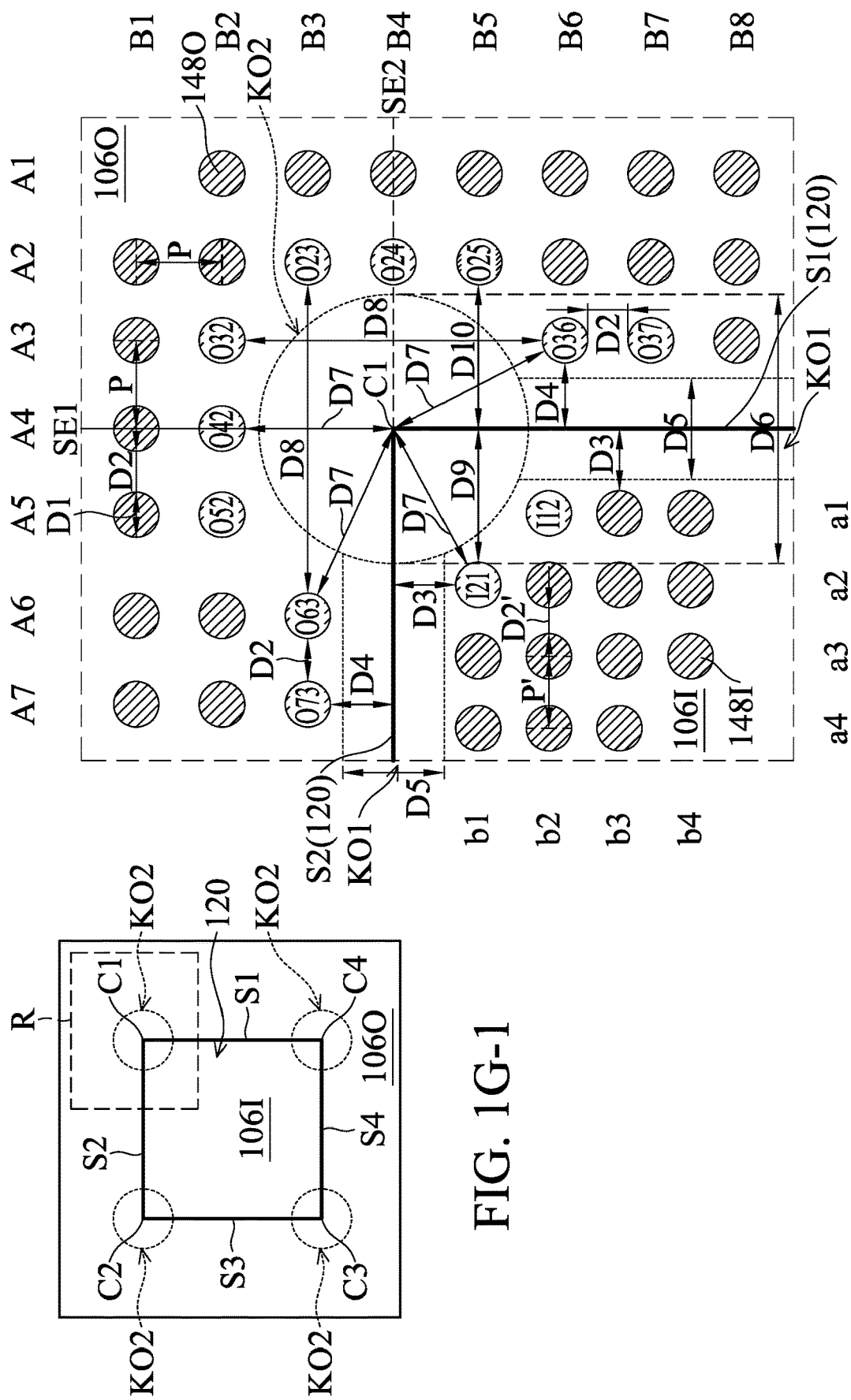

FIG. 1G-1 is a plan view of the package structure shown in FIG. 1G, in accordance with some embodiments of the disclosure. FIG. 1G-2 is an enlarged plan view of area R shown in FIG. 1G-1 to illustrate details of the bonding elements 148 proximate to the corner C1 of the semiconductor die 120, in accordance with some embodiments of the disclosure. For illustration simplicity, features of the package structure may be described below using the bonding elements 148 proximate to the corner C1 of the semiconductor die 120, but these features can be suitable for other regions of the package structure such as the bonding elements 148 proximate to the corners C2-C4 of the semiconductor die 120.

FIG. 1G-2 illustrates footprints (or projections) of the bonding elements 148 projected onto the fan-in region 106I and the fan-out region 106O of the redistribution structure 106. In FIG. 1G-2, the sidewalls S1 and S2 of the semiconductor die 120 are aligned with the boundary between the fan-in region 106I and the fan-out region 106O of the redistribution structure 106, in accordance with some embodiments.

The bonding elements 148 include the inner bonding elements 148I disposed within the fan-in region 106I and the outer bonding elements 148O disposed within the fan-out region 106O, in accordance with some embodiments. In some embodiments, the plurality of inner bonding elements 148I and the plurality of the outer bonding elements 148O are each arranged into an array.

FIG. 1G-2 illustrates a portion of an exemplary array of the outer bonding elements 148O including columns A1-A7 and rows B1-B8 and a portion of an exemplary array of the inner bonding elements 148I including columns a1-a4 and rows b1-b4. The direction of columns A1-A7 and the direction of columns a1-a4 may be parallel to the sidewall S1 of the semiconductor die 120, and the direction of row B1-B8 and the direction of row b1-b4 may be parallel to the second sidewall S2 of the semiconductor die 120. The direction of columns A1-A7 is substantially perpendicular to the direction of rows B1-B8, and the direction of columns a1-a4 is substantially perpendicular to the direction of rows b1-b4.

In some embodiments, an extending line SE1 of the sidewall S1 of the semiconductor die 120 passes through column A4, and an extending line SE2 of the sidewall S2 of the semiconductor die 120 passes through column B4.

In some embodiments, the bonding elements 148 (including 148O and 148I) have a size D1 in a range from about 50 μm to about 150 μm. In some embodiments, a distance D2 between neighboring outer bonding elements 148O is in a range from about 50 μm to about 200 μm. In some embodiments, the pitch P of the outer bonding elements 148O is in a range from about 100 μm to about 250 μm.

In some embodiments, a distance D2' between neighboring inner bonding elements 148I is in a range from about 50 μm to about 200 μm. The distance D2' may be less than the distance D2. In some embodiments, the pitch P' of the inner bonding elements 148I is in a range from about 100 μm to about 250 μm. The pitch P' may be less than the pitch P. In some embodiments, the ratio of pitch P' to pitch P is in a range from about 0.5 to about 1.

In some embodiments, in FIG. 1G-2, the inner bonding elements 148I are spaced apart from the periphery of the semiconductor die 120. That is, the footprints of the inner bonding elements 148I do not overlap the periphery of the semiconductor die 120, in accordance with some embodiments. For example, column a1 of the inner bonding elements 148I is spaced apart from the sidewall S1 by a distance D3. Row b1 of the inner bonding elements 148I is spaced apart from the sidewall S2 by a distance D3. In some embodiments, the distance D3 is in a range from about 50 μm to about 200 μm. The distance D3 may be greater than the distance D2'. In some embodiments, the ratio of distance D3 to distance D2' is in a range from about 1 to about 3.

In some embodiments, in FIG. 1G-2, the outer bonding elements 148O are spaced apart from the periphery of the semiconductor die 120. That is, the footprints of the outer bonding elements 148O do not overlap the periphery of the semiconductor die 120, in accordance with some embodiments. For example, column A3 of the outer bonding elements 148O is spaced apart from the sidewall S1 by a distance D4. Row B3 of the outer bonding elements 148O is spaced apart from the sidewall S2 by a distance D4. In some embodiments, the distance D4 is in a range from about 50 μm to about 200 μm. The distance D4 may be greater than the distance D2. The distance D4 may be the equal to the distance D3. In some embodiments, the ratio of distance D4 to distance D2 is in a range from about 1 to about 3.

Therefore, a first keep-out zone KO1 is defined, in accordance with some embodiments. In some embodiments, none of the bonding elements 148I and 148O is disposed within the first keep-out zone KO1. In other words, the first keep-out zone KO1 may be free from the bonding elements 148I and 148O in some embodiments. In some embodiments, in FIG. 1G-2, the first keep-out zone KO1 is aligned with and extends along the periphery of the semiconductor die 120. In some embodiments, the first keep-out zone KO1 has a width D5 spanning the semiconductor die 120. The first keep-out zone KO1 may be a hollow ring area. In some embodiments, the distance D3 and/or D4 are greater than or equal to half of the width D5. In some embodiments, the width D5 is in a range from about 100 μm to about 400 μm.

In some embodiments, in FIG. 1G-2, the bonding elements 148I and 148O are spaced apart from the corner (e.g., C1) of the semiconductor die 120 by a distance. For example, bonding elements 148 labeled O63, O52, O42, O32, O23, O24, O25, O36, I12 and I21 are a group of the bonding elements 148 closest to the corner C1 of the semiconductor die 120. The bonding elements O63, O52, O42, O32, O23, O24, O25, O36, I12 and I21 are spaced apart from the corner C1 of the semiconductor die 120 by distances D7. For these bonding elements, the distances D7 may not be the same. In some embodiments, the distance D7 is greater than the size D1, the distance D2, the distance D2', the pitch P, the pitch P' and the distance D3, and the distance D4. In some embodiments, the distance D7 is in a range from about 200 μm to about 500 μm.

In some embodiments, the ratio of distance D7 to size D1 is in a range from about 1.5 to about 8, such as about 2.5 to about 8, or about 4 to about 8. In some embodiments, the ratio of distance D7 to distance D2 is in a range from about 1.5 to about 10, such as about 2.5 to about 10, or about 4 to about 10. In some embodiments, the ratio of distance D7 to distance D3 or D4 is in a range from about 1.5 to about 10, such as about 2.5 to about 10, or about 4 to about 10.

Therefore, a second keep-out zone KO2 is defined, in accordance with some embodiments. In some embodiments, none of the bonding element 148I and 148O is disposed within the second keep-out zone KO2. In other words, the second keep-out zone KO2 may be free from the bonding elements 148I and 148O in some embodiments. By defining the keep-out zone KO2 of the bonding elements 148, the bonding elements 148I and 148O may be kept at an appropriate distance from the corners C1-C4 of the semiconductor die 120, thereby reducing or mitigating a tensile stress induced by the bonding elements 148 and applied to a subsequently formed underfill material.

The second keep-out zone KO2 may be a circular area. In some embodiments, in FIG. 1G-2, the center of the circular area of the second keep-out zone KO2 is located at the corner C1. In some embodiments, the circular area of the second keep-out zone KO2 has a diameter D6 that is greater than the size D1, the distance D2, the distance D2', the pitch P, the pitch P' and the distance D3, the distance D4, and the width D5. In some embodiments, the distance D7 are greater than or equal to half of the diameter D6. In some embodiments, the diameter D6 is in a range from about 350 μm to about 450 μm. In some embodiments, the ratio of diameter D6 to pitch P is in a range from about 1.5 to about 10.

If the diameter D6 of the keep-out zone KO2 (or the ratio of the diameter D6 to the pitch P) is too small, the stress applied to a subsequently formed underfill material may not be effectively mitigated, thereby increasing the risk of cracking of a subsequently formed underfill material. If the diameter D6 of the keep-out zone KO2 is too large, it may reduce the density of routing of the resulting package structure.

In illustrated embodiments, because of the presence of the second keep-out zone KO2, the positions (A5,B3), (A4,B3), (A3,B3), (A3,B4), (A3,B5), (a1,b1) of the arrays of the bonding elements 148O and 148I are reserved without disposing bonding elements.

In illustrated embodiments, row B3 includes consecutively arranged bonding elements O73, O63 and O23. The bonding elements O73 and O63 and the bonding element O23 are located on the opposite sides of an extending line SE1 of the sidewall S1 of the semiconductor die 120. A distance D8 between the bonding element O23 and the bonding element O63 is greater than size D1, the distance D2, the distance D2', the pitch P, the pitch P' and the distance D3, the distance D4, the width D5, the distance D7 and the diameter D6.

In illustrated embodiments, column A3 includes consecutively arranged bonding elements O37, O36 and O32. The bonding elements O37 and O36 and the bonding element O32 are located on the opposite sides of an extending line SE2 of the sidewall S2 of the semiconductor die 120. A distance D8 between the bonding element O32 and the bonding element O36 is greater than the size D1, the distance D2, the distance D2', the pitch P, the pitch P' and the distance D3, the distance D4, the width D5, the distance D7 and the diameter D6.

In illustrated embodiments, the minimum distance D9 between row b1 and the sidewall S1 (e.g., the distance between the bonding element 121 and the sidewall S1) is greater than the minimum distance D3 between row b2 and the sidewall S1 (e.g., the distance between bonding element 112 and the sidewall S1).

In illustrated embodiments, the minimum distance D10 between row B5 and the sidewall S1 (e.g., the distance between the bonding element O25 and the sidewall S1) is greater than the minimum distance D4 between row B6 and the sidewall S1 (e.g., the distance between bonding element O36 and the sidewall S1).

Figure 1H:
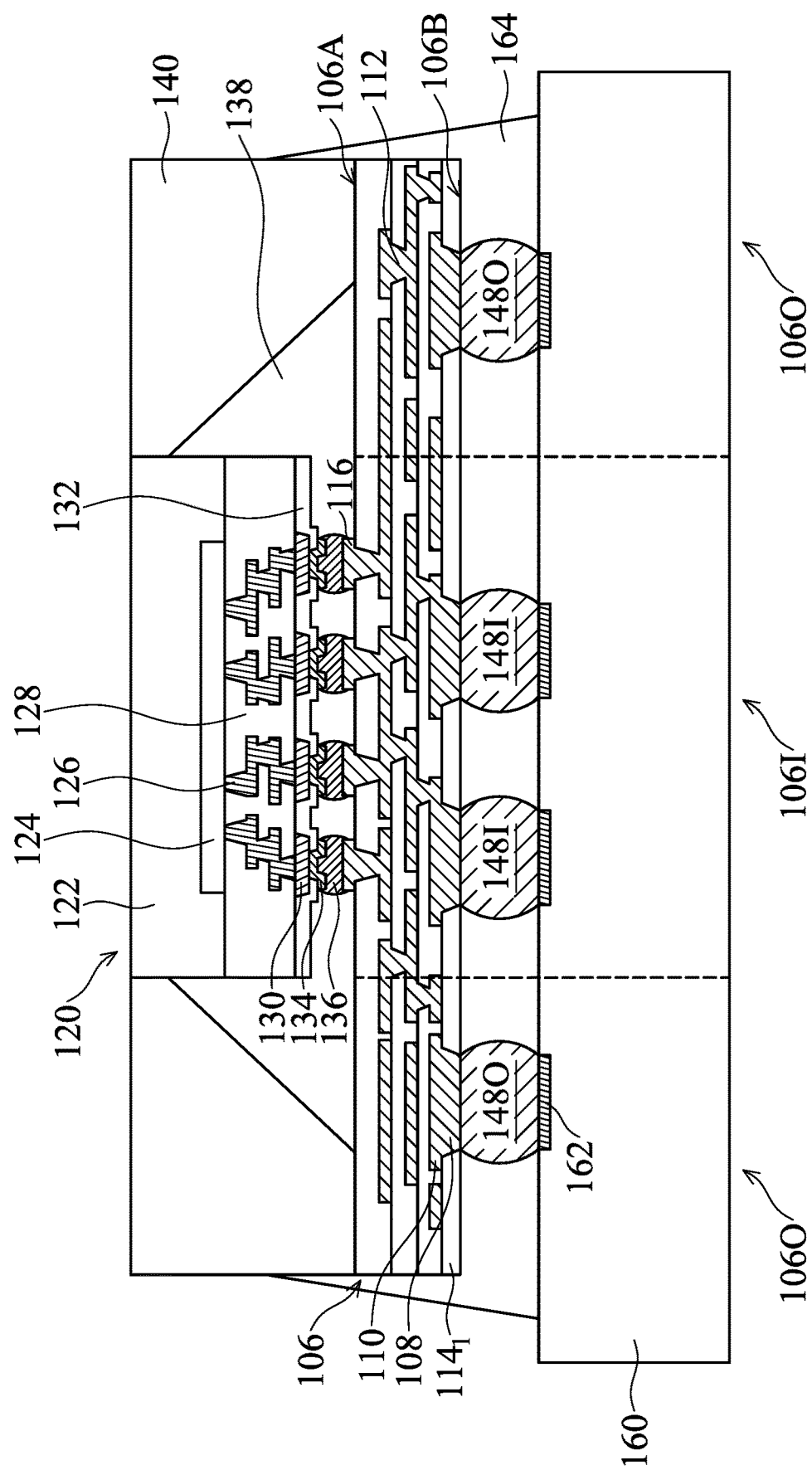
Figure 2:
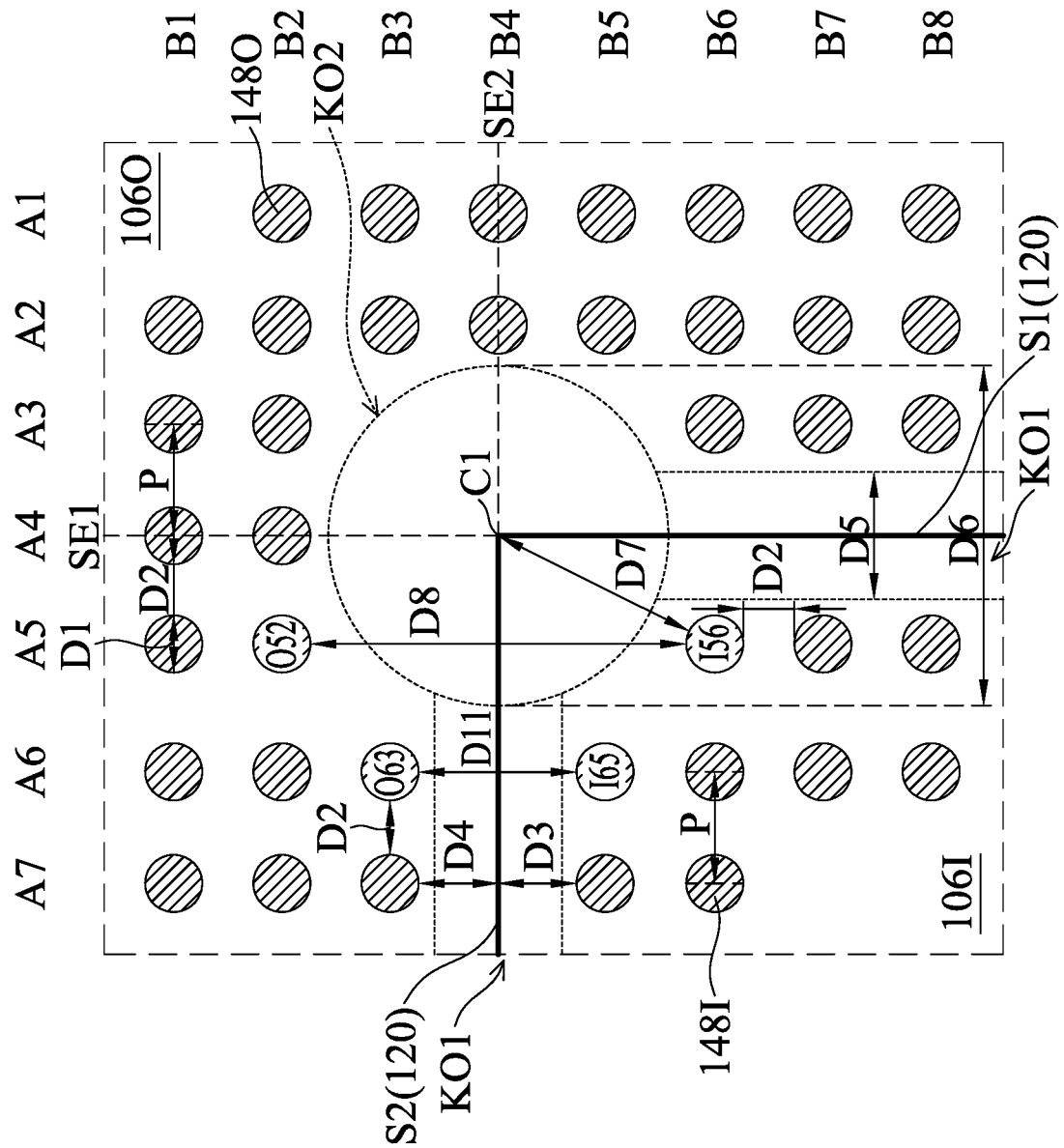

An underfill material 164 is formed over the upper surface of the substrate 160 and encapsulates the package structure 146 and the bonding elements 148, as shown in FIG. 1H, in accordance with some embodiments. The underfill material 164 fills the spacing between the bonding elements 148, in accordance with some embodiments. The underfill material 164 covers the sidewalls of the molding compound 140 and the sidewalls of the redistribution structure 106, in accordance with some embodiments.

In some embodiments, the underfill material 164 is an electrically insulated adhesive for protecting the bonding elements 148 and/or securing the package structure 146. In some embodiments, the underfill material 164 is made of epoxy, resin, epoxy molding compounds, another suitable underfill material, and/or a combination thereof.

A large difference of coefficients of thermal expansion (CTE) may exist between the substrate 160 and the semiconductor die 120, and thus a tensile stress may be induced and applied to the underfill material 138 during reliability tests, operations of the package structure and/or thermal processes. The bonding elements 148, which are more rigid than neighboring components, may concentrate the tensile stress at the corners C1-C4 of the semiconductor die 120. As such, the concentration of the tensile stress may cause cracks to be formed within the underfill material 138 from the corners of the semiconductor die 120.

In accordance with the embodiments of the present disclosure, by defining the keep-out zone KO2, the bonding elements 148I and 148O of the resulting package structure are kept at an appropriate distance from the corners C1-C4 of the semiconductor die 120, thereby reducing or mitigating the tensile stress induced by the bonding elements 148 and applied to the underfill material 138. As a result, the risk of cracking of the underfill material 138 may be reduced, and thus the performance and reliability of the package structure may be improved.

FIG. 2 is a modification of FIG. 1G-2, in accordance with some embodiments of the disclosure. The package structure of FIG. 2 is similar to the package structure of FIG. 1G-2, except that the inner bonding elements 148I and the outer bonding elements 148O have the same pitch P.

In some embodiments, the inner bonding elements 148I and the outer bonding elements 148O, having the same pitch P, are arranged into one array. FIG. 2 illustrates a portion of an exemplary array of the inner bonding elements 148I and the outer bonding elements 148O including columns A1-A7 and rows B1-B8.

In Illustrated embodiments, column A6 includes bonding element O63 and 165 which are consecutively arranged and located on the opposite sides of the sidewall S2 of the semiconductor die 120. In Illustrated embodiments, column A5 includes bonding element O52 and 156 which are consecutively arranged and located on the opposite sides of the sidewall S2 of the semiconductor die 120. In some embodiments, a distance D11 between the element O63 and 165 is less than a distance D8 between the bonding element O52 and I56.

Figure 3:
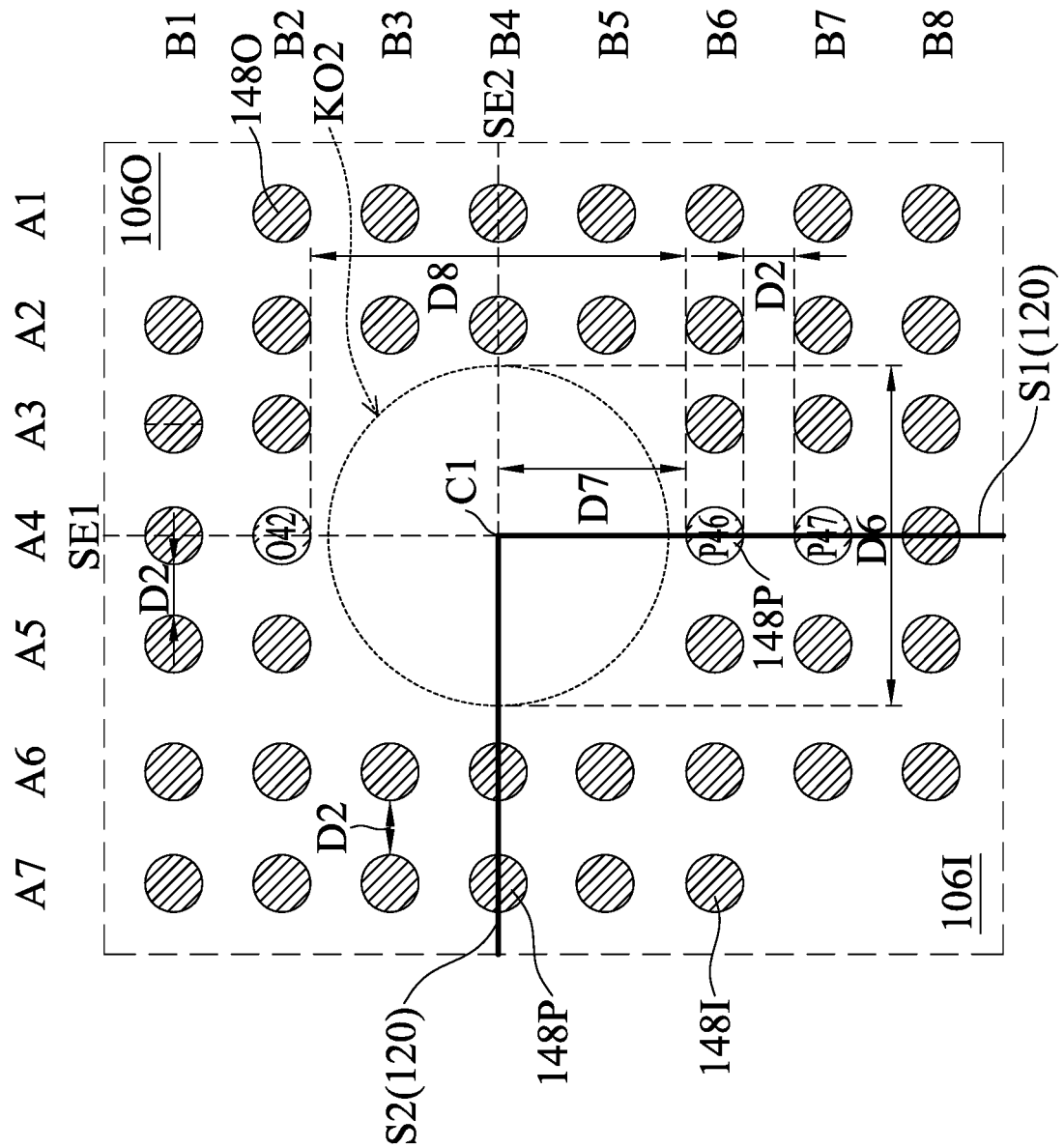
FIG. 3 is a modification of FIG. 2, in accordance with some embodiments of the disclosure.

FIG. 3 is a modification of FIG. 2, in accordance with some embodiments of the disclosure. The package structure of FIG. 3 is similar to the package structure of FIG. 2, except without the first keep-out zone KO1.

Some of the bonding elements 148 are disposed to overlap the boundary between the fan-in region 106I and the fan-out region 106O (or the periphery of the semiconductor die 120) and referred to as on-boundary bonding elements 148P, in accordance with some embodiments. That is, in FIG. 3, the sidewalls S1 and S2 pass through the on-boundary bonding elements 148P. In some embodiments, the inner bonding elements 148I, the outer bonding elements 148O and the on-boundary bonding elements 148P are arranged into one array.

In illustrated embodiments, column A4 includes consecutively arranged bonding elements P47, P46 and O42. The bonding elements P47, P46 and the bonding element O42 are located on the opposite sides of an extending line SE2 of the sidewall S2 of the semiconductor die 120. A distance D8 between the bonding element O42 and the bonding element P46 is greater than the distance D2 between the bonding element P46 and the bonding element P47.

FIG. 4 is a modification of the cross-sectional view illustrated in FIG. 1H, in accordance with some embodiments of the disclosure. The package structure of FIG. 4 is similar to the package structure of FIG. 1H, except for the package structure of FIG. 4 including four semiconductor dies 120, in accordance with some embodiments.

Four semiconductor dies 120 are disposed over the top surface 106A of the redistribution structure 106, as shown in FIG. 4, in accordance with some embodiments. The semiconductor dies 120 shown in FIG. 4 are similar to the semiconductor dies 120 described with respect to FIG. 1B, in accordance with some embodiments. The semiconductor dies 120 are bonded to the conductive features 116 through bonding elements 136, in accordance with some embodiments. The integrated circuits (not shown) of the semiconductor dies 120 are electrically coupled to the substrate 160, in accordance with some embodiments.

FIG. 4-1 is a plan view of the package structure shown in FIG. 4, in accordance with some embodiments of the disclosure. In some embodiments, the semiconductor dies 120 are arranged side by side. In some embodiments, the semiconductor dies 120 are disposed correspondingly within the fan-in regions 106I of the redistribution structure 106. In FIG. 4-1, the sidewalls of the semiconductor dies 120 are aligned with the boundary between the fan-in regions 106I and the fan-out region 106O of the redistribution structure 106, in accordance with some embodiments.

FIG. 4-1 illustrates second keep-out zones KO2 at the corners of each of the semiconductor dies 120. Although neighboring two second keep-out zones KO2 are illustrated as merging with one another, neighboring two second keep-out zones KO2 may be spaced apart from one another. Some details of the arrangement of the bonding elements 148 proximate to the corner of the semiconductor dies 120 will be described later.

Figures 1, 5:
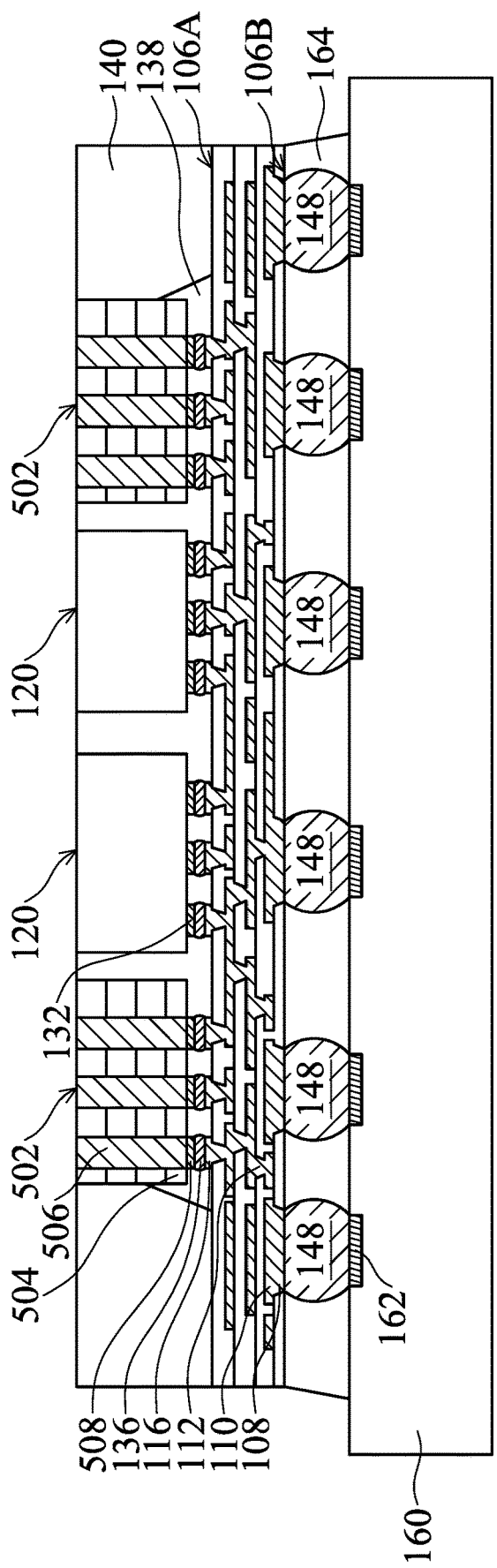

FIG. 5 is a modification of the cross-sectional view illustrated in FIG. 4, in accordance with some embodiments of the disclosure. The package structure of FIG. 5 is similar to the package structure of FIG. 4, except for the package structure of FIG. 5 including two semiconductor dies 120 and two packages 502, in accordance with some embodiments.

Two packages 502 are disposed over the top surface 106A of the redistribution structure 106, as shown in FIG. 5, in accordance with some embodiments. In some embodiments, each package 502 includes high bandwidth memory (HBM) device. For example, the package 502 includes multiple stacked memory chips 504 and conductive through holes 506 electrically coupled to the packages 502. The package 502 also includes conductive pads 508 which are in contact with the conductive through holes 506 and bonded to the conductive features 116 through the bonding elements 136, in accordance with some embodiments.

The components of the package 502 shown in FIG. 5 are merely for the purpose of illustration. In alternative embodiments, the package 502 is a chip-scale package (CSP), chip on wafer on substrate (CoWoS) package, a system on integrated chip (SoIC) package, and/or a three dimensional integrated circuit (3DIC).

FIG. 5-1 is a plan view of the package structure shown in FIG. 5, in accordance with some embodiments of the disclosure. The semiconductor dies 120 and the packages 502 are disposed within the fan-in regions 106I of the redistribution structure 106. In FIG. 5-1, the sidewalls of the semiconductor dies 120 and the packages 502 are aligned with the boundary between the fan-in regions 106I and the fan-out region 106O of the redistribution structure 106, in accordance with some embodiments. In some embodiments, the size of the packages 502 is smaller than the size of the semiconductor dies 120. Multiple packages 502 may be arranged along a sidewall of a semiconductor die 120.

FIG. 5-1 Illustrates second keep-out zones KO2 at the corners of each of the semiconductor dies 120 and the packages 502. Although neighboring two second keep-out zones KO2 are illustrated as merging with one another, neighboring two second keep-out zones KO2 may be spaced apart from one another. Some details of the arrangement of the bonding elements 148 proximate to the corner of the semiconductor dies 120 and/or the packages 502 will be described later.

Figure 6:
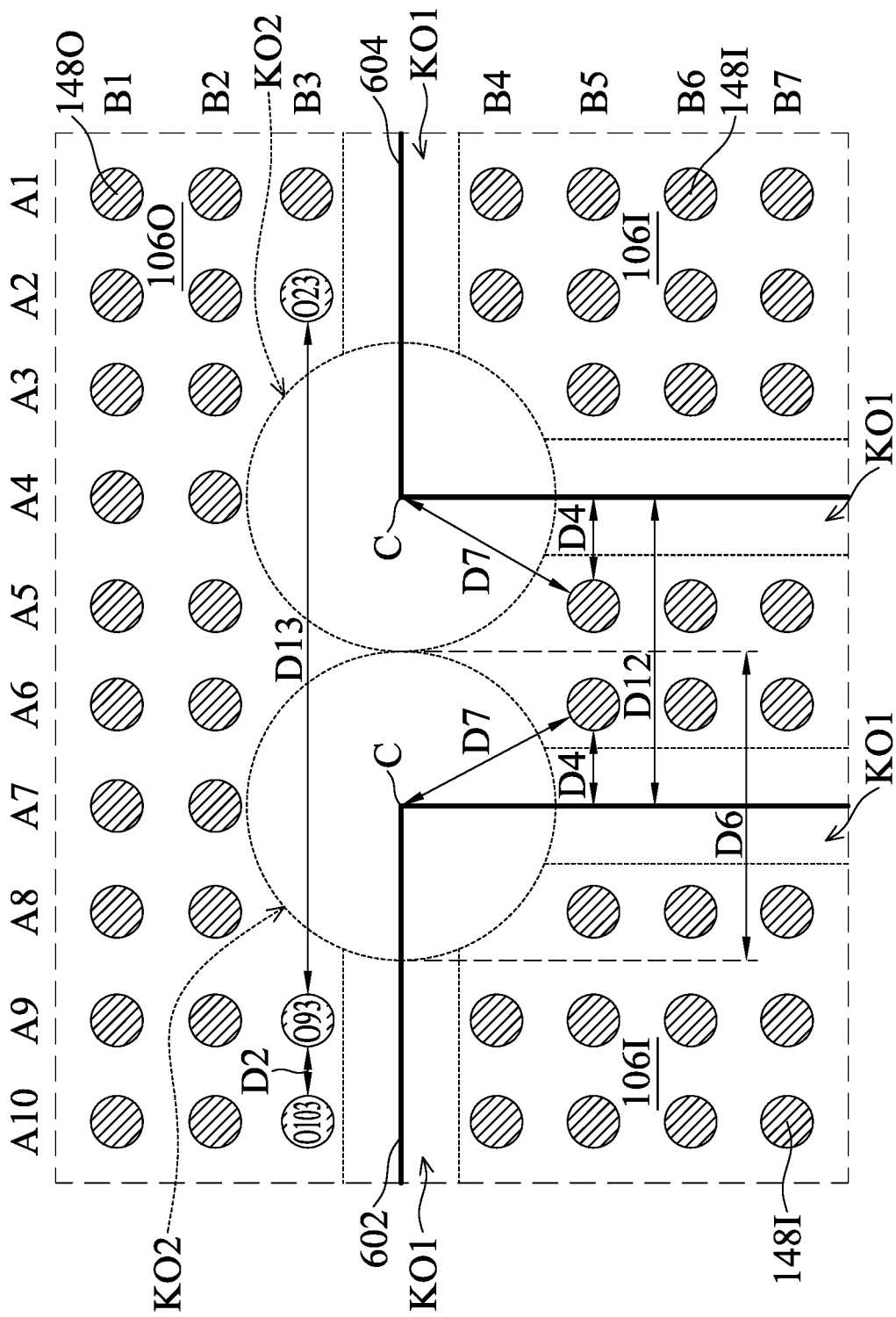
FIG. 6 is an enlarged plan view of area R shown in FIG. 4-1 or FIG. 5-1 to illustrate details of bonding elements, in accordance with some embodiments of the disclosure.

FIG. 6 is an enlarged plan view of area R shown in FIG. 4-1 or FIG. 5-1 to illustrate details of the bonding elements 148 proximate to the corners of package components, in accordance with some embodiments of the disclosure. The package structure of FIG. 6 includes package components 602 and 604, in accordance with some embodiments. Either or both of the package components 602 and 604 may be the semiconductor die 120 or the package 502 described above, in accordance with some embodiments. FIG. 6 illustrates footprints (or projections) of the bonding elements 148 projected onto the fan-in region 106I and the fan-out region 106O of the redistribution structure 106.

In some embodiments, the inner bonding elements 148I and the outer bonding elements 148O are arranged into one array. FIG. 6 illustrates a portion of an exemplary array of the inner bonding elements 148I and the outer bonding elements 148O including columns A1-A10 and rows B1-B7.

The package component 602 is spaced apart from the package component 604 by a distance D12, as shown in FIG. 6, in accordance with some embodiments. In some embodiments, the distance D12 is greater than or equal to the diameter D6 of the second keep-out zone KO2. In some embodiments, the circular areas of two second keep-out zones KO2 may be spaced apart from one another or tangent at a point. In some embodiments, the distance D12 is greater than the distance D7 which is the distance between the corner C1 and the bonding elements 148 closest to the corner C1.

In illustrated embodiments, row B3 includes consecutively arranged bonding elements O103, O93 and O23. Because of the presence of the second keep-out zones KO2, a distance D13 between the bonding element O93 and the bonding element O23 is greater than distance D2 between the bonding element O103 and the bonding element O93 and the distance D12.

Figure 7:
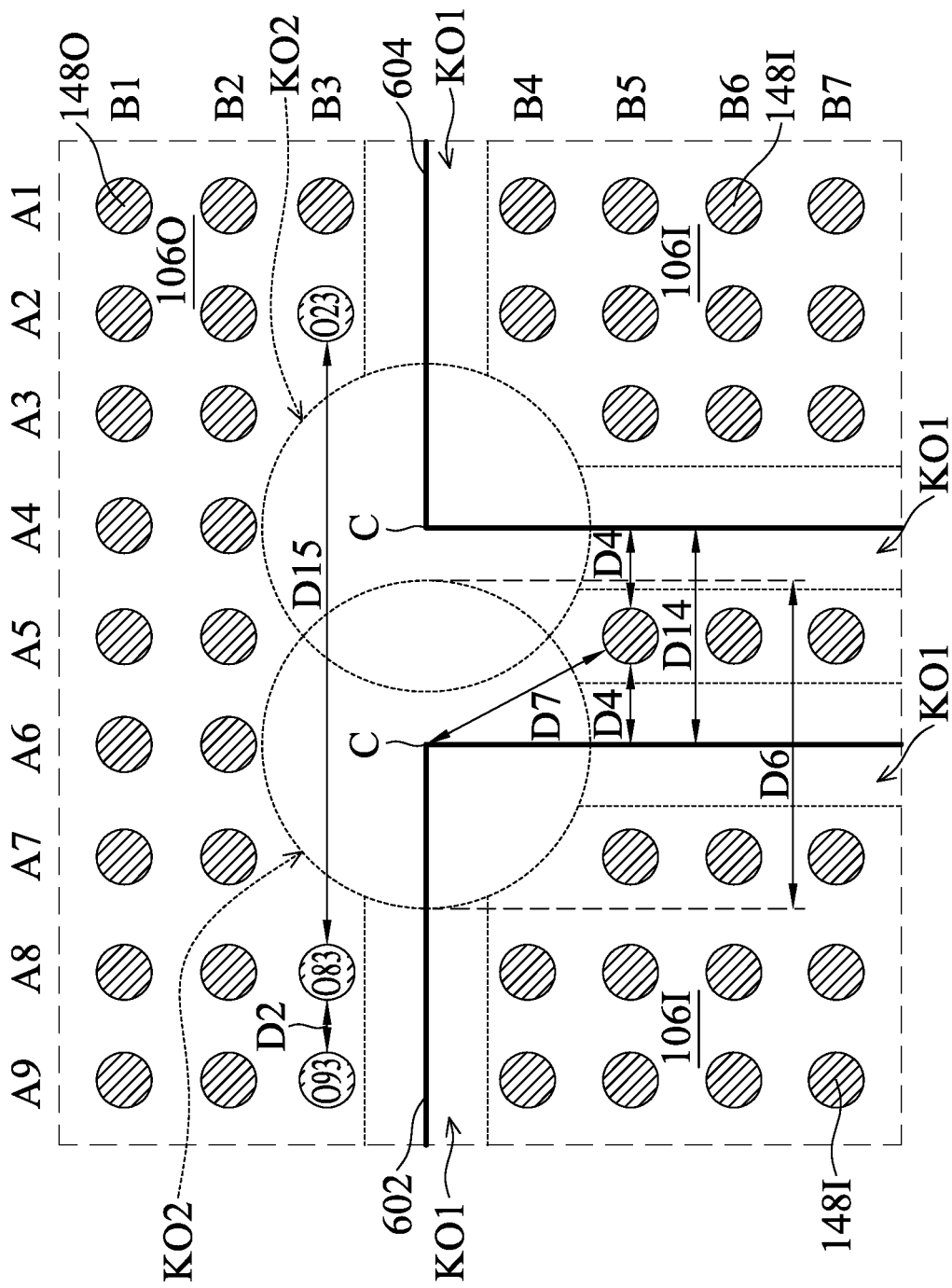
FIG. 7 is an enlarged plan view of area R shown in FIG. 4-1 or FIG. 5-1 to illustrate details of bonding elements, in accordance with some embodiments of the disclosure.

FIG. 7 is an enlarged plan view of area R shown in FIG. 4-1 or FIG. 5-1 to illustrate details of the bonding elements 148 proximate to the corners of package components, in accordance with some embodiments of the disclosure. The package structure of FIG. 7 is similar to the package structure of FIG. 6, except for a distance between the package components 602 and 604 in FIG. 7 is less than that shown in FIG. 6.

The package component 602 is spaced apart from the package component 604 by a distance D14, as shown in FIG. 7, in accordance with some embodiments. In some embodiments, the distance D14 is less than the diameter D6 of the second keep-out zone KO2. In some embodiments, the circular areas of two second keep-out zones KO2 overlap with each other. In some embodiments, the distance D14 is equal to or less than the distance D7 which is the distance between the corner C1 and the bonding elements 148 closest to the corner C1.

In illustrated embodiments, row B3 includes consecutively arranged bonding elements O93, O83 and O23. A distance D15 between the bonding element O83 and the bonding element O23 is greater than distance D2 between the bonding element O93 and the bonding element O83 and the distance D14.

Figure 8:
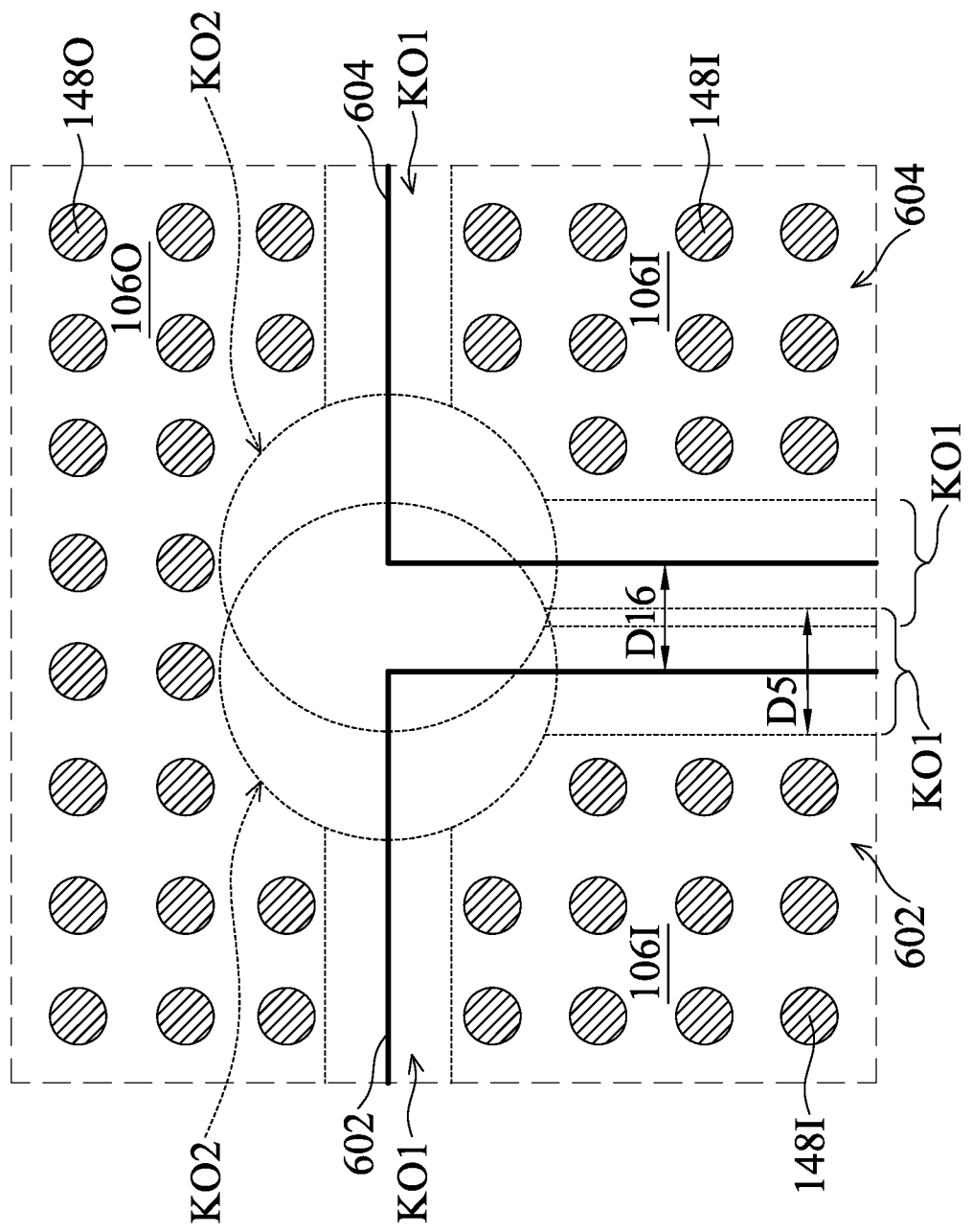
FIG. 8 is an enlarged plan view of area R shown in FIG. 4-1 or FIG. 5-1 to illustrate details of bonding elements, in accordance with some embodiments of the disclosure.

FIG. 8 is an enlarged plan view of area R shown in FIG. 4-1 or FIG. 5-1 to illustrate details of the bonding elements 148 proximate to the corners of package components, in accordance with some embodiments of the disclosure. The package structure of FIG. 8 is similar to the package structure of FIG. 7, except for a distance between the package components 602 and 604 in FIG. 8 is less than that shown in FIG. 7.

The package component 602 is spaced apart from the package component 604 by a distance D16, as shown in FIG. 8, in accordance with some embodiments. In some embodiments, the distance D16 is less than the width D5 of the first keep-out zone KO1. In some embodiments, the areas of two first keep-out zones KO1 overlap with each other. As such, none of the outer bonding element 148O is disposed between the package components 602 and 604. In other words, the space between the package components 602 and 604 may be free from the outer bonding element 148O in some embodiments.

Figure 9:
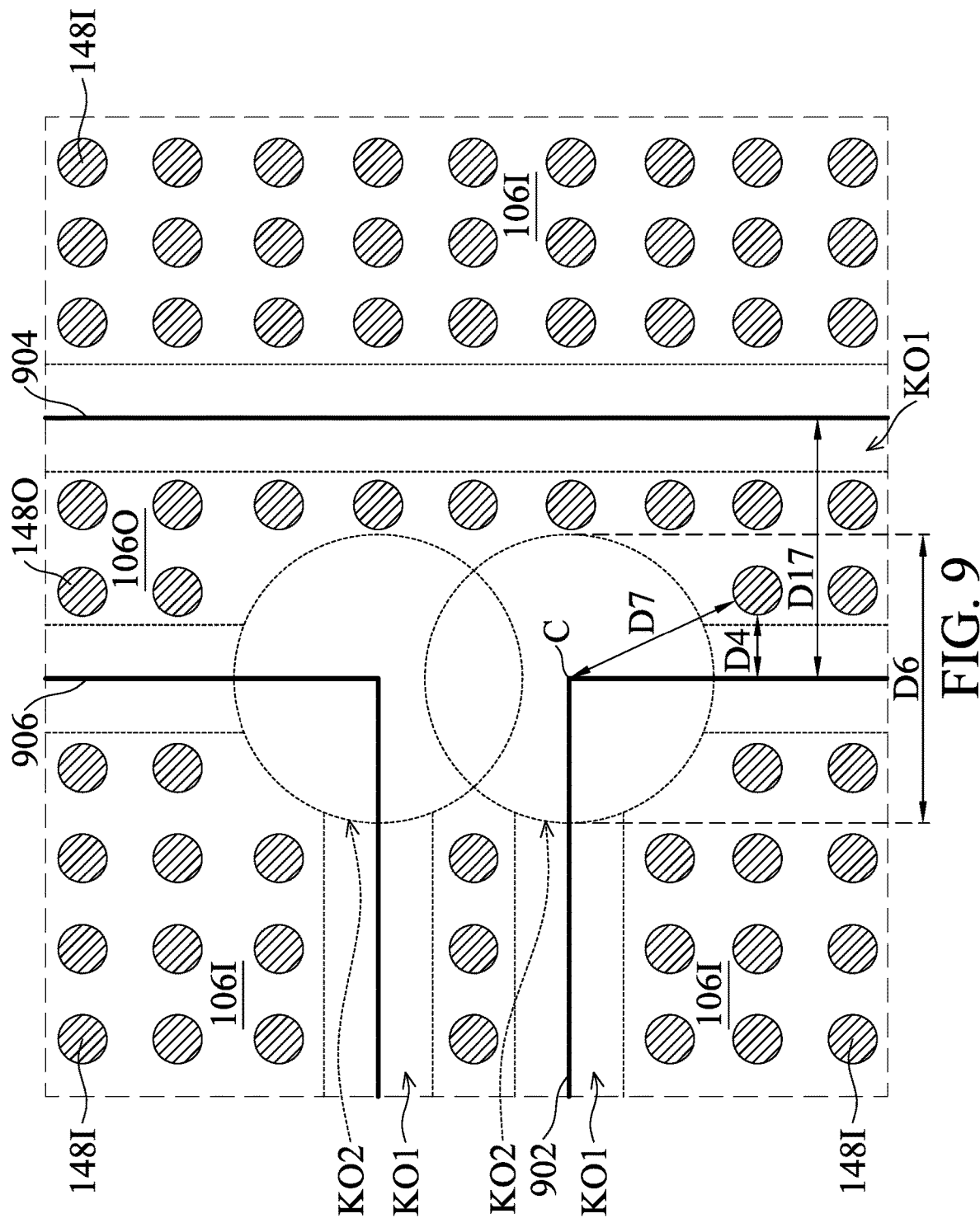
FIG. 9 is an enlarged plan view of area R1 shown in FIG. 5-1 to illustrate details of bonding elements, in accordance with some embodiments of the disclosure.

FIG. 9 is an enlarged plan view of area R1 shown in FIG. 5-1 to illustrate details of the bonding elements 148 proximate to the corner of package components, in accordance with some embodiments of the disclosure. The package structure of FIG. 9 includes package components 902, 904 and 906, in accordance with some embodiments. One, two or all of the package components 902, 904 and 906 may be the semiconductor die 120 or the package 502 described above, in accordance with some embodiments.

The size of the package component 904 may be greater than the size of the package component 902 and the size of the package component 906. The package component 902 and 906 are disposed along a sidewall of the package component 904, in accordance with some embodiments. FIG. 9 illustrates footprints (or projections) of the bonding elements 148 projected onto the fan-in region 106I and the fan-out region 106O of the redistribution structure 106.

In some embodiments, the inner bonding elements 148I and the outer bonding elements 148O are arranged into one array. The package component 904 is spaced apart from the package component 902 and/or 906 by a distance D17, as shown in FIG. 9, in accordance with some embodiments. In some embodiments, the distance D17 is greater than or equal to the sum of the size D1, half of the width D5 and half of the diameter D6.

Figure 10:
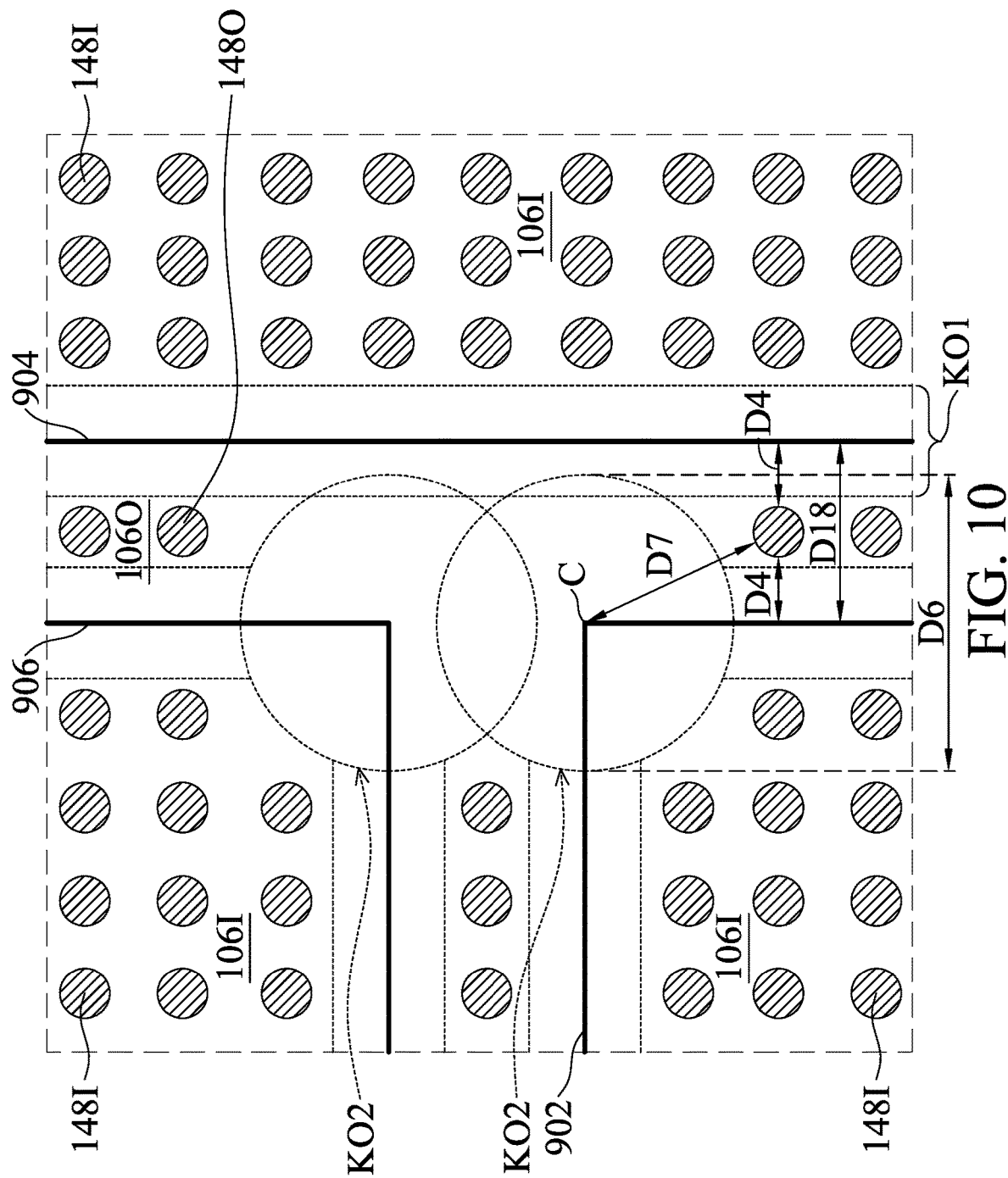
FIG. 10 is an enlarged plan view of area R1 shown in FIG. 5-1 to illustrate details of bonding elements, in accordance with some embodiments of the disclosure.

FIG. 10 is an enlarged plan view of area R1 shown in FIG. 5-1 to illustrate details of the bonding elements 148 proximate to the corner of package components, in accordance with some embodiments of the disclosure. The package structure of FIG. 10 is similar to the package structure of FIG. 9, except for a distance between the package components 902 and 904 in FIG. 10 is less than that shown in FIG. 9.

The package component 904 is spaced apart from the package component 902 and/or 906 by a distance D18, as shown in FIG. 10, in accordance with some embodiments. In some embodiments, the distance D18 is less than or equal to the sum of half of the width D5 and half of the diameter D6.

FIG. 11 is an enlarged plan view of area R1 shown in FIG. 5-1 to illustrate details of the bonding elements 148 proximate to the corner of package components, in accordance with some embodiments of the disclosure. The package structure of FIG. 11 is similar to the package structure of FIG. 10, except for a distance between the package components 902 and 904 in FIG. 11 is less than that shown in FIG. 10.

The package component 904 is spaced apart from the package component 902 and/or 906 by a distance D19, as shown in FIG. 11, in accordance with some embodiments. In some embodiments, the distance D19 is less than or equal to half of the diameter D6. In some embodiments, the areas of first keep-out zones KO1 and the circular area of the second keep-out zone overlap with each other. As such, none of the outer bonding element 148O is disposed between the package components 902 and 904 and between the package components 906 and 904. In other words, the space between the package components 902 and 904, and the space between the package components 906 and 904 may be free from the outer bonding element 148O in some embodiments.

As described above, the embodiments of the present disclosure provide a package structure which includes the semiconductor die 120 over the top surface 106A of the redistribution structure 106 and the bonding elements 148 over the bottom surface 106B of the redistribution structure 106. The bonding elements 148 may be kept at an appropriate distance from the corners C1-C4 of the semiconductor die 120 by defining the keep-out zone KO2 of the bonding elements 148, thereby reducing or mitigating a tensile stress induced by the bonding elements 148 and applied to the underfill material 138. As a result, the risk of cracking of the underfill material 138 may be reduced, and thus the performance and reliability of the package structure may be improved.

Embodiments of a package structure may be provided. The package structure may include a redistribution structure, a semiconductor die over the redistribution structure, and bonding elements below the redistribution structure. The semiconductor die has a first sidewall and a second sidewall intersecting at a corner. In a plan view, a row of bonding elements may be immediately adjacent to the second sidewall and is spaced apart from the second sidewall by a first distance. A first bonding element of the row may be the bonding element in the first row closest to the corner. A second distance between the second bonding element and the corner is greater than the first distance. Therefore, the bonding elements may be kept at an appropriate distance from the corner of the semiconductor die. As a result, the risk of cracking of an underfill material may be reduced, and thus the performance and reliability of the package structure may be improved.

In some embodiments, a package structure is provided. The package structure includes a semiconductor die over a redistribution structure, bonding elements below the redistribution structure, and an underfill layer surrounding the bonding elements and the redistribution structure. The semiconductor die has a rectangular profile in a plan view. A pitch of the bonding elements is defined as the sum of a diameter of the bonding elements and a spacing between neighboring two of the bonding elements. A first circular area of the redistribution structure is entirely covered and in direct contact with the underfill layer. The center of the first circular area is aligned with a first corner of the rectangular profile of the semiconductor die. A diameter of the first circular area is greater than twice the pitch of the bonding elements.

In some embodiments, a package structure is provided. The package structure includes a semiconductor die bonding to a first surface of a redistribution structure, and inner bonding elements bonding to a second surface of the redistribution structure and located within an area of the semiconductor die. The semiconductor die has a first sidewall and a second sidewall connected to the first sidewall. The inner bonding elements are defined into a first row of inner bonding elements and a second row of inner bonding elements. The first row and the second row extend parallel to the second sidewall. The second row is located between the first row and the second sidewall. A minimum distance between the first row and the first sidewall is less than a minimum distance between the second row and the first sidewall.

In some embodiments, a package structure is provided. The package structure includes a first package component and a second package component over a redistribution structure, and a first row of bonding elements below the redistribution structure. The first package component has a first sidewall and a second sidewall connected to the first sidewall. The second package component has a third sidewall and a fourth sidewall connected to the third sidewall. In a plan view, the first row is immediately adjacent to the first sidewall and the third sidewall. The first row includes a first bonding element, a second bonding element and a third bonding element consecutively arranged in a direction parallel to the first sidewall and the third sidewall. An extension line of the second sidewall passes between the second bonding element and the third bonding element. An extension line of the fourth sidewall passes between the second bonding element and the third bonding element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a semiconductor die bonding to a first surface of a redistribution structure, wherein the semiconductor die has a first sidewall and a second sidewall connected to the first sidewall; and
inner bonding elements bonding to a second surface of the redistribution structure and located within an area of the semiconductor die, wherein the inner bonding elements are defined into a first row of inner bonding elements and a second row of inner bonding elements, the first row and the second row extend parallel to the second sidewall, the second row is located between the first row and the second sidewall, and a minimum distance between the first row and the first sidewall is less than a minimum distance between the second row and the first sidewall,
wherein there are no inner bonding elements between the first row and the first sidewall, and there are no inner bonding elements between the second row and the first sidewall.

2. The package structure as claimed in claim 1, wherein a distance between the second row and the second sidewall is less than the minimum distance between the second row and the first sidewall.

3. The package structure as claimed in claim 1, further comprising:
outer bonding elements bonding to the second surface of the redistribution structure and located outside the area of the semiconductor die, wherein the outer bonding elements are defined into a third row of outer bonding elements and a fourth row of outer bonding elements, the third row and the fourth row extend parallel to an extending line of the second sidewall, the fourth row is located between the third row and the extending line of the second sidewall, and a minimum distance between the third row and the first sidewall is less than a minimum distance between the fourth row and the first sidewall.

4. The package structure as claimed in claim 3, wherein a distance between neighboring two of the inner bonding elements is different than a distance between neighboring two of the outer bonding elements.

5. The package structure as claimed in claim 3, wherein the outer bonding elements are further defined into a fifth row of outer bonding elements, and the extending line of the second sidewall passes through the fifth row.

6. The package structure as claimed in claim 3, further comprising:
an underfill layer encapsulating the inner bonding elements.

7. A package structure, comprising:
a first package component and a second package component over a redistribution structure, wherein the first package component has a first sidewall and a second sidewall connected to the first sidewall, and the second package component has a third sidewall and a fourth sidewall connected to the third sidewall; and
a first row of bonding elements below the redistribution structure, wherein in a plan view, the first row is immediately adjacent to the first sidewall and the third sidewall, the first row comprises a first bonding element, a second bonding element and a third bonding element consecutively arranged in a direction parallel to the first sidewall and the third sidewall, an extension line of the second sidewall passes between the second bonding element and the third bonding element, and an extension line of the fourth sidewall passes between the second bonding element and the third bonding element.

8. The package structure as claimed in claim 7, wherein the second bonding element is spaced apart from the third bonding element by a first distance, and the first package component is spaced apart from the second package by a second distance that is less than the first distance.

9. The package structure as claimed in claim 7, further comprising:
a first column of bonding elements below the redistribution structure, wherein in a plan view, the first column extends between and parallel to the second sidewall and the fourth sidewall.

10. The package structure as claimed in claim 9, wherein a fourth bonding element is a bonding element in the first column closest to a corner between the first sidewall and the second sidewall, and a ratio of a first distance between the fourth bonding element and the corner to a second distance between the fourth bonding element and the second sidewall is in a range from about 2.5 to about 10.

11. The package structure as claimed in claim 7, wherein the first package component and the second package component are semiconductor dies.

* * * * *